United States Patent [19]
Hiraiwa et al.

[11] Patent Number: 6,025,955
[45] Date of Patent: *Feb. 15, 2000

[54] OPTICAL MEMBER FOR PHOTOLITHOGRAPHY, METHOD FOR EVALUATING OPTICAL MEMBER, AND PHOTOLITHOGRAPHY APPARATUS

[75] Inventors: Hiroyuki Hiraiwa; Issey Tanaka, both of Yokohama; Katsuya Miyoshi, Nerima-ku, all of Japan

[73] Assignee: Nikon Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/892,953

[22] Filed: Jul. 15, 1997

Related U.S. Application Data

[63] Continuation of application No. 08/465,494, Jun. 5, 1995, abandoned.

[30] Foreign Application Priority Data

Jun. 16, 1994 [JP] Japan .................................. 6-134723

[51] Int. Cl.[7] .............................. G02B 13/14; G02B 3/00
[52] U.S. Cl. ........................... 359/355; 359/664; 356/124
[58] Field of Search .................................... 359/350, 355, 359/664, 124; 65/104; 356/121

[56] References Cited

U.S. PATENT DOCUMENTS

| | | | |
|---|---|---|---|
| 4,696,569 | 9/1987 | Geary et al. | 356/124 |
| 5,086,352 | 2/1992 | Yamagata et al. | 359/350 |
| 5,157,555 | 10/1992 | Reno | 359/823 |
| 5,234,742 | 8/1993 | Hatano et al. | 359/350 |

OTHER PUBLICATIONS

Freitag et al., "Aberration analysis in aerial images formed by lithographic lenses", *Applied Optics*, May 1, 1992, vol. 31, No. 13, pp. 2284–2290.

U.S. patent application 08/193,474 filed on Feb. 8, 1994 by Hiraiwa et al.

*Primary Examiner*—Jon Henry
*Attorney, Agent, or Firm*—Pennie & Edmonds LLP

[57] ABSTRACT

In a method for evaluating the homogeneity of the refractive index of an optical member, the refractive index distribution of the optical member is measured, the measured refractive index distribution is separated into a rotationally symmetric element and a non-rotationally symmetric element in the optical axis direction before or after correction of the power element, and the rotationally symmetric element is further subjected to 2nd/4th-order element correction. Upon execution of such comprehensive evaluation, a photolithography optical member, which can realize a fine, sharp exposure-transfer pattern (e.g., a line width of 0.3 μm or less) is provided.

11 Claims, 23 Drawing Sheets

IMAGED ABERRATION DATA

| CONTOUR LINE INTERVAL | .0100 λ |

OPTICAL MEMBER FOR PHOTOLITHOGRAPHY, METHOD FOR EVALUATING OPTICAL MEMBER, AND PHOTOLITHOGRAPHY APPARATUS

This is a continuation of application Ser. No. 08/465,494, filed Jun. 5, 1995, now abandoned.

BACKGROUND OF THE INVENTION

1. Field of the Invention

The present invention relates to an optical member for photolithography, adapted for use in an optical system such as lenses, mirrors, and the like in a specific wavelength region of 400 nm or less and, preferably, 300 nm or less in an ultraviolet (UV)-lithography technique.

The present invention also relates to a method for evaluating an optical member for photolithography.

2. Related Background Art

In recent years, VLSIs have shown remarkable progress in the level of integration and in their functions. In the field of logic VLSIs, there is being developed the system-on-chip concept, incorporating a large system on a chip. With such tendencies, there is being required finer patterning and higher integration on the substrate such as silicon wafer. In a photolithography technique for exposing and transferring fine patterns of an integrated circuit onto a wafer such as silicon, there is employed an exposure apparatus called a stepper.

As an example, in the field of DRAM, along with advancement from LSI to VLSI, or with the increase in capacity 1K→256K→1M→4M→16M, there are required steppers capable of reproducing progressively decreasing the line width of patterns 10 $\mu$m→2 $\mu$m→1 $\mu$m→0.8 $\mu$m→0.5 $\mu$m.

For this reason, a projection lens of the stepper is required to have a high resolution and a large focal depth. The resolution and the focal depth are determined by the wavelength of light used for exposure and the numerical aperture (N.A.) of a lens.

As the pattern becomes finer, the angle of diffracted light increases, and it becomes difficult to receive the diffracted light unless the lens has a large N.A. On the other hand, as the exposure wavelength $\lambda$ is shorter, the angle of diffracted light becomes smaller if the pattern remains the same size, so that, the N.A. can be small.

The resolution and the focal depth are represented as follows:

Resolution=$k1 \cdot \lambda / N.A.$

Focal Depth=$k2 \cdot \lambda / N.A.^2$ (where k1 and k2 are coefficients of proportion.)

An improvement in the resolution can be achieved by an increase in N.A. or by a reduction in $\lambda$. As can be seen from the above equations, the reduction in $\lambda$ is more advantageous in consideration of the focal depth. From this viewpoint, the wavelength of a light source is being shortened from the g-line (436 nm) to the i-line (365 nm), and further to a KrF excimer laser (248 nm) or an ArF excimer laser (193 nm).

An optical system incorporated in a stepper is composed of a combination of a large number of optical members such as lenses. Even if the amount of light loss in the transmittance per a single lens is small, it is accumulated by the number of lenses, and the accumulated light loss leads to a significant decrease in illumination intensity. For this reason, each optical member is required to have a high transmittance.

Thus, in a short wavelength region of 400 nm or less, optical glass manufactured by a special method which takes light loss due to short wavelength and combination of optical members into account is employed. Furthermore, it is proposed to use synthesized silica glass or monocrystalline such as $CaF_2$ (fluorite) in a wavelength region of 300 nm or less.

On the other hand, in order to realize a smaller line width and to obtain fine and sharp exposure patterns, or fine and sharp transfer patterns, it is indispensable to obtain as a projection lens an optical member which has a highly homogeneity of refractive index (a small fluctuation of refractive index in a measurement range). However, due to recent enlargement of exposure area along with enlargement of semiconductor wafer, the aperture size and thickness of such a material are increasing, and it is becoming harder to obtain the above-mentioned quality of the material. Thus, in order to improve the homogeneity of the refractive index of an optical member with a large aperture size and thickness, various attempts have been made.

The homogeneity of the refractive index has been conventionally represented by the difference between the maximum and minimum values of the refractive index with the measurement range (to be referred to as $\Delta n$ hereinafter), and an optical member is considered to have higher homogeneity as this value becomes smaller. For this reason, existing "high-homogeneity" optical members are manufactured to minimize $\Delta n$.

However, a fine, sharp exposure-transfer pattern cannot often be obtained, even though an optical member with sufficiently small $\Delta n$, e.g., an optical member on the $10^{-6}$ order or less, which is generally considered as a high-homogeneity optical member, is used.

The present inventors have proposed a photolithography silica glass member (U.S. patent application Ser. No. 08/193,474 now abandoned) which is used in a specific wavelength range of 400 nm or less, and in which the RMS (root mean square) value of wavefront aberration is $0.015\lambda$ or less after the removal of tilt power, the slant element of the refractive index is $\pm 5 \times 10^{-6}$ or less, or the refractive index distribution is rotationally symmetrical with an axis, and the axis of rotationally symmetric is coinciding the central axis of the silica glass member.

SUMMARY OF THE INVENTION

It is an object of the present invention to provide an optical member for photolithography, which can realize a fine, sharp exposure-transfer pattern (e.g., a line width of 0.3 $\mu$m or less) by adopting a principle different from those of the existing techniques in evaluation of the homogeneity of the refractive index of an optical member used in a photolithography technique, and executing comprehensive evaluation.

The present inventors have made extensive studies as to the homogeneity of an optical member which can obtain fine, sharp exposure-transfer patterns in the photolithography technique. As a result, the present inventors found that an evaluation method to be described below gave a satisfactory correlation between the homogeneity and the line width of the patterns. Based on this correlation, a fine, sharp exposure-transfer pattern having a line width of 0.3 $\mu$m or less could be obtained in an optical system comprising optical members which satisfied conditions to be described below.

More specifically, the present invention firstly provides a method for evaluating the homogeneity of the refractive index of an optical member, which is characterized in that the wavefront aberration of the optical member is measured in evaluation and the measured wavefront aberration is separated into a rotationally symmetric element and a non-rotationally symmetric element in the optical axis direction. The present invention also provides an optical member which can be suitably used in the photolithography technique using light having a wavelength of 400 nm or less, as a result of evaluation of this evaluation method, and a photolithography apparatus comprising this optical member.

The present invention secondly provides a method of evaluating an optical member, which is characterized in that the wavefront aberration of an optical member is measured, the measured wavefront aberration is separated into a rotationally symmetric element and a non-rotationally symmetric element in the optical axis direction before or after a power element is corrected, and the 2nd- and 4th-order elements of the rotationally symmetric element are further corrected. The present invention also provides an optical member which can be suitably used in the photolithography technique using light having a wavelength of 400 nm or less, as a result of evaluation of this evaluation method, and a photolithography apparatus comprising this optical member.

By using the photolithography optical member and a method of evaluating an optical member according to the present invention, a fine, sharp exposure-transfer pattern (e.g., a line width of 0.3 $\mu$m) can be realized. Although adjustment upon assembling of a conventional optical system requires many steps, an optical system using the optical member of the present invention allows easy adjustment. The reason for easy adjustment will be described below.

According to a finding of the present inventors, the refractive index distribution of an optical member consists of a power (2nd-order) element, a tilt element, and other residual elements, as shown in FIG. 1. The residual elements include an astigmatic element, a random element, and a rotationally symmetric element.

In the above-mentioned proposal (U.S. patent application Ser. No. 08/193,474 now abandoned), the present inventors indicated that the refractive index distribution of an optical member is separated into a power (2nd-order) element, an astigmatic element, a rotationally symmetric element after elimination of the power element, a tilt element, a random element, and the like, and the influences of these elements on the optical performance are different from each other. Of these elements, the power element is equivalent to an error of the radius of curvature of an optical system, and can be easily corrected by adjusting the air spaces between lenses. Note that the power element here means a refractive index distribution which can be approximated by a quadratic curve.

The present inventors have made extensive studies, and found that the following method was effective to evaluation of the optical performance of an optical member, i.e., residual aberrations which cannot be easily corrected by the air spaces between lenses.

1. In order to evaluate the respective elements of the refractive index distribution of an optical member, the power (2nd-order) element and the tilt element, which can be corrected by adjusting the optical system, are eliminated from wavefront aberration measured by an interferometer.

2. The astigmatic element is eliminated since it can be eliminated by rotation of lenses in the optical system.

3. The wavefront aberration obtained by data processing steps 1 and 2 is separated into a rotationally symmetric element and a non-rotationally symmetric element.

4. The non-rotationally symmetric element is directly evaluated since it cannot be eliminated by adjusting the air spaces between lenses.

5. Of the rotationally symmetric element, the 2nd- and 4th-order elements are eliminated (corrected) since they can be eliminated by adjusting the air spaces of lenses, and thereafter, elements of high even orders equal to or higher than the 6th order wavefront aberration are evaluated.

Upon evaluation of the non-rotationally symmetric element of the wavefront aberration in step 4 by simulation, it was revealed that required optical performance was obtained if RMS=0.004$\lambda$ or less was set.

Step 5 will be described in more detail below. In the present invention, the rotationally symmetric element is further developed into a polynomial, and only elements which actually influence the optical performance are evaluated in more detail.

Upon examination of optical aberrations attributed to the respective terms of the polynomial by simulation, it was found that aberrations which could be corrected by adjusting the air spaces of lenses were those generated in the 2nd- and 4th-order elements of refractive index distributions, and aberrations which could not be corrected were those generated by refractive index distributions (2nd- and 4th-order residuals) of high even orders equal to or higher than the 6th order.

Upon execution of simulation of a relation between 2nd- and 4th-order residuals of wave-front aberrations and actually residual high-order aberrations, a very high correlation was observed (FIG. 2).

As a result of further examination, it was found that required optical performance was obtained by setting residuals after correction of 2nd- and 4th-order elements to be RMS=0.005$\lambda$ or less or setting the PV value of a 2nd/4th-order correction curve itself to be PV=0.024$\lambda$ or less.

The method of evaluating the homogeneity of an optical member according to the present invention will be described in more detail below.

The measurement of the refractive index distribution of an optical member is performed by a conventional method. However, the measurement method of the present invention is not limited to that of the refractive index distribution, but may be applied to, e.g., the measurement of surface precision of a lens.

An optical member formed in a columnar or rectangular parallelopiped shape is used as a sample for an optical system of a laser interferometer, and wavefront aberration is measured by an oil on-plate method using a matching oil. The wavefront aberration obtained by the interferometer can be converted into a refractive index distribution by dividing it with the thickness of the optical member. The present invention is characterized in that the following data processing is additionally performed for the measured wavefront aberration.

FIG. 3 is a graph showing the general correction based on the 2nd- and 4th-order elements of the wavefront aberration according to the present invention.

As shown in FIG. 3, a 2nd/4th-order function curve which fits the wavefront aberration is obtained by simulation, the displacement amount between the function curve and the wavefront aberration will be referred to as a 2nd/4th-order residual, and the calculation of this approximate curve will be referred to as 2nd/4th-order element correction in the present invention.

FIG. 4 is a flow chart showing the flow of the data processing of the present invention.

Aberration data is obtained by the interferometer in a measurement range shown in FIG. 5. From the aberration data which is acquired, wavefront aberration is calculated to obtain a PV value and an RMS value (result 1). The PV value is conventionally used in evaluation of an optical member.

$$PV = \max\{d(x, y)\} - \min\{d(x, y)\} \quad (1)$$

$$RMS = \sqrt{\frac{\sum d(x, y)^2}{n}}$$

d(x,y): aberration data at the position (x,y)
n: the total number of data

In general, when a lens surface is measured by an interferometer, an aberration error which is not the wavefront aberration of the lens itself is often superposed due to the difference between the curvatures of the reference wavefront irradiated by the interferometer and the surface to be measured, as shown in FIG. 6.

This aberration error w will be referred to as a power element or focus element hereinafter.

$$w(x,y) = A(x^2 + y^2) + Bx + Cy + D \quad (2)$$

Upon measurement, as shown in FIG. 7, an aberration error which is not the wavefront aberration of the lens itself due to the tilt of a support table for measurement is often generated.

This aberration error w will be referred to as a tilt element hereinafter.

In order to eliminate the power element and the tilt element as the aberration error, fitting is performed by a least square method using equation (2) above, thereby subtracting the power element and the tilt element.

When the homogeneity of the refractive index of an optical member is measured, the power element as aberration error can be ignored, but the power element originating from the refractive index distribution is reflected in a measurement value. This element is also subtracted by performing fitting by the least square method using equation (2) above.

In this manner, an RMS value and a PV value after subtraction of the power element and the tilt element can be obtained (result 2).

Subsequently, in order to eliminate an astigmatic element of the wavefront aberration, fitting is performed by the least square method using the following equations, thereby subtracting the astigmatic element from the wavefront aberration from which the power and tilt elements have already been subtracted.

$$w(x, y) = A(x^2 + y^2) + 2Bxy \quad (3)$$

$$\text{Asymmetry Amount: } l^2\sqrt{A^2 + B^2} \quad (4)$$

$$\text{Direction: } \tan^{-1}\frac{B}{A + \sqrt{A^2 + B^2}} \text{ (rad)} \quad (5)$$

From equations (3) to (5), the amount and direction of the astigmatic element, and an RMS value and a PV value after subtraction of the astigmatic element are obtained (result 3).

Furthermore, a rotationally symmetric element is calculated. As a calculation method, a division method and a non-division method are available.

In the division method, the measurement data of the wavefront aberration is divided into n data, as shown in FIGS. 8 and 9, and data of the respective sections are calculated.

Then, the section data of the rotationally symmetric element are calculated by one of the following methods.

1) An average of data on an identical r-coordinate of the n section data is defined as the section data of the rotationally symmetric element at that position (average mode).

2) A minimum value of data on an identical r-coordinate of the n section data is defined as the section data of the rotationally symmetric element at that position (minimum value mode).

3) Aspherical surface fitting is performed for the n section data by the least square method using the following equation, and the calculated aspherical surface data is defined as the section data of the rotationally symmetric element (least square mode).

$$w(r) = C_0 + C_2 r^2 + C_4 r^4 + C_6 r^6 + \ldots \quad (6)$$

Finally, the calculated section data of the rotationally symmetric element is rotated to obtain a rotationally symmetric element of the entire measurement range, and its RMS and PV values are calculated.

In the non-division method, since the wavefront aberration data is a group of pixels, the respective pixels have distances from the center, as shown in FIG. 10.

In view of this, the data of the rotationally symmetric element is calculated by three methods similar to those of the division method.

1) An average of data of pixels having the same distance from the center is calculated, and is defined as the data of the corresponding pixels (average mode).

2) A minimum value of data of pixels having the same distance from the center is calculated, and is defined as the data of the corresponding pixels (minimum value mode).

3) Aspherical surface fitting is performed for all data by the least square method using the following equation, and the calculated aspherical surface data is defined as the data of the corresponding pixels (least square mode).

$$w(r) = C_0 + C_2 r^2 + C_4 r^4 + C_6 r^6 + \ldots \quad (6)$$

Finally, the RMS and PV values of the calculated rotationally symmetric element are calculated.

Subsequently, a random element is calculated by subtracting the rotationally symmetric element from the wavefront aberration data before the calculation of the rotationally symmetric element.

Furthermore, the RMS and PV values of the random element are calculated.

In this manner, the rotationally symmetric element and the random element can be separated.

As for the random element, this RMS value is used as a reference value.

The rotationally symmetric element is processed by another correction method.

Fitting of an even-order polynomial is performed for the sections of the rotationally symmetric element by the least square method (FIG. 3).

$$w(r) = C_0 + C_2 r^2 + C_4 r^4 + C_6 r^6 + \ldots \quad (6)$$

With this fitting, the influence of noise can be eliminated from original data before fitting.

Fitted data are subtracted from the sections of the original rotationally symmetric element, and the RMS and PV values of the residual data are calculated (residual RMS and PV values).

Aspherical surface fitting up to the 4th order is performed to even-order polynomial data calculated in the term of the aspherical surface fitting (FIG. 3).

$$w(r)=C_0+C_2r^2+C_4r^4 \qquad (7)$$

Thereafter, the 4th-order polynomial data is subtracted from the even-order polynomial data, and the RMS and PV values of the residual data are calculated (2nd/4th-order residual RMS and PV values).

Furthermore, the PV value (PV value for correction) of the 4th-order polynomial data is also calculated.

With the series of processing operations, the RMS values of the 2nd/4th-order residual and the non-rotationally symmetric (random) element can be obtained. Other calculated data are used upon adjustment of the lenses.

The following explanation can be given as to the fact that the 2nd- and 4th-order elements are those which can be corrected by adjusting the air spaces between lenses.

When the refractive index distribution after power correction is represented by only the 2nd- and 4th-order elements, we have:

$$n(r)=n_0+C_2r^2+C_4r^4 \qquad (8)$$

Differentiation of this equation yields:

$$n'(r)=2C_2r+4C_4r^3 \qquad (9)$$

Furthermore, if this approximation is possible, an optimal shape of the refractive index distribution of an optical member is also revealed in terms of minimizing the 2nd/4th-order residual.

If n(1)=0 when r=1, n'(0.7)=0 when r=0.7.

More specifically, a shape having a peak value at a 70% position of the radius allows the easiest 2nd/4th-order element correction. According to the simulation results, the 2nd/4th-order residual does not raise any problem as long as the shape has a peak value at a 65% to 75% position of the radius.

The manufacturing method for obtaining such an optical member is as follows while taking silica glass as an example.

As the manufacturing method of silica glass, a so-called direct method described in, e.g., U.S. patent application Ser. No. 193,474, which has a higher excimer laser durability and can obtain a larger shape than other manufacturing methods, is used.

The refractive index distribution of silica glass is determined by the impurities and the density distribution. The impurities include OH, Cl, metal impurities, and dissolved gases, and it is considered in the case of the direct method that OH contained by several hundred ppm or more, and Cl contained by several ten ppm are dominant in terms of their mixing amounts. Since the contents of other impurities are as small as 50 ppb or less according to the analysis result, their influence on the refractive index can be ignored.

On the other hand, as the density distribution, the density distribution due to heat history is dominant. This distribution is present independently of the manufacturing methods such as the direct method, VAD (vapor axial deposition) method, sol-gel method, plasma burner method, and the like. Since the refractive index distribution is determined by these elements, in order to obtain homogeneity of the refractive index with small non-rotationally symmetric elements, the manufacturing method which can always maintain the geometrical central position in steps ① synthesis, ② a heat treatment for obtaining the homogeneity or changing the shape, ③ annealing for removing distortion, and ④ mechanical working such as cutting, rounding, and the like is required. An example of the manufacturing method will be described below.

When synthesis of silica glass is performed while rotating an ingot, the impurity concentration distribution, physical property distribution, and the refractive index distribution based on them become symmetrical about the center of the ingot.

The obtained ingot is cut into a cylindrical shape. Since a round surface of this cylindrical shape is that of the ingot itself, if the geometrical center of the cylindrical shape is determined from the round surfaces, the determined center is the center upon synthesis of the ingot, i.e., the center of the refractive index distribution. When this point is marked on the circular cut surface, and is used as the central reference for the following working process such as cutting, rounding, and the like, she central axis of the ingot can be matched with the central axis of the silica glass member, thus finally obtaining an optical member which is symmetrical about its center, and has a refractive index distribution with small random elements.

An optical system includes lenses having various diameters. In order to obtain a lens in which the 2nd/4th-order residual of the rotationally symmetric element is small, the following procedure is required.

Conventionally, the homogeneity of the refractive index is evaluated using a cylindrical lens material which is cut from an ingot and is subjected to a heat treatment such as annealing, and after a lens with a useable diameter is assumed, the lens material is worked into a cylindrical shape as a sum of the assumed lens shape and a working margin. With this cylindrical shape approximate to the lens shape, the quality of the lens material is finally evaluated.

In the state of the cylindrical lens material, the homogeneity is measured by the interferometer. A lens with a diameter, which has a peak value of wavefront aberration after correction of the power element in the neighborhood of a 70% position of its radius, is assumed, and the lens material is worked into a cylindrical shape approximate to the assumed lens shape, thus obtaining an optical member in which the 2nd/4th-order residual of the rotationally symmetric element is small.

The working process of silica glass by the direct method will be described below with reference to FIG. 11.

In FIG. 11, since an ingot 11 is synthesized while being rotated, the impurity concentration distribution and physical property distribution always become symmetrical about the center of the ingot. However, since a cylindrical silica glass material 12 is cut while maintaining the center, the yield per unit weight extremely decreases unless an ingot having a diameter close to a required material diameter is used.

The rotationally symmetric element will be described below.

As described above, the refractive index distribution is determined by the impurities and the density distribution due to heat history, and these elements can be controlled by synthesis conditions.

Assume that the gas flow rates of source materials, oxygen, hydrogen, and the like, the discharge flow rate driving units for rotation, pull-down, and the like, which are considered to influence variations of the synthesis conditions, are controllable with high precision. Also, the optical axis of a laser beam is used as the reference axis, and a furnace, driving units, and burner are aligned with high precision.

After the refractive index distribution of an ingot obtained by synthesis performed using the above-mentioned apparatus is measured by an interferometer, the synthesis conditions are adjusted to further decrease the 2nd/4th-order residual.

More specifically, the conditions are controlled by controlling the gas flow rate of the burner or by two-dimensionally moving a target placed on an X-Y stage relative to the burner.

Also, in a heat treatment after the synthesis, the conditions can be controlled by a heat treatment which is performed while controlling heat dissipation upon cooling by placing an $SiO_2$ powder or solid on the upper, lower, and side surfaces, by adjusting the cooling rate upon annealing, or by adjusting the holding pressure in an HIP treatment.

When a heat treatment such as annealing is performed, a cylindrical material shape must be selected to maintain symmetry, and the material must be heated at the center of the furnace having a rotationally symmetrical temperature distribution. The silica glass material is preferably rotated. When the material is to be subjected to viscous deformation, care must be taken not to cause local deformation.

With these methods, the refractive index distribution can be adjusted to obtain a desired optical member.

Furthermore, when the material is worked by, e.g., rounding to obtain a silica glass member 13, the central position must be marked before working, and the working must be performed while preventing any displacement. The silica glass member 13 is further worked and polished to manufacture a projection lens 14. FIG. 12 is a schematic view of an excimer laser stepper. When projection lenses 14 with various shapes manufactured by the above-mentioned process are combined and assembled in a lens barrel, an exposure-transfer projection lens system 24 is completed. In FIG. 12, reference numeral 21 denotes an excimer laser device; 22, an illumination system for the excimer laser stepper; 23, a reticle; and 25, a silicon wafer which is projected in a reduced scale. With these operations, optical performance for obtaining a fine, sharp pattern in the photolithography technique can be obtained.

More specifically, as described above, according to the present invention, a fine pattern with a line width of 0.3 $\mu$m or less can be obtained in the photolithography technique.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

First Embodiment

A high-purity synthesized silica glass ingot was synthesized by a so-called direct method which used a chlorine compound gas of high-purity silicon as a source, burned oxygen gas and hydrogen gas using a silica-glass multi-layer burner, and ejected the source gas diluted with the carrier gas. Upon synthesis, a target consisting of an opaque silica glass plate on which silica glass powder was deposited was rotated and oscillated at a predetermined period, and was pulled down at the same time, thereby maintaining the same distance between the position of the ingot upper portion and the burner. In addition to these motions, the temperature distribution of the ingot upper portion was measured, and the burner and the ingot were two-dimensionally moved in accordance with the obtained information. This is to optimize the homogeneity of the refractive index distribution of silica glass to be obtained by combining the temperature distribution pattern of the ingot upper portion defined by the shape of the burner, the gas flow rates, and the like, and the temperature distribution pattern defined by a relative movement between the burner and the ingot.

Figure 23:
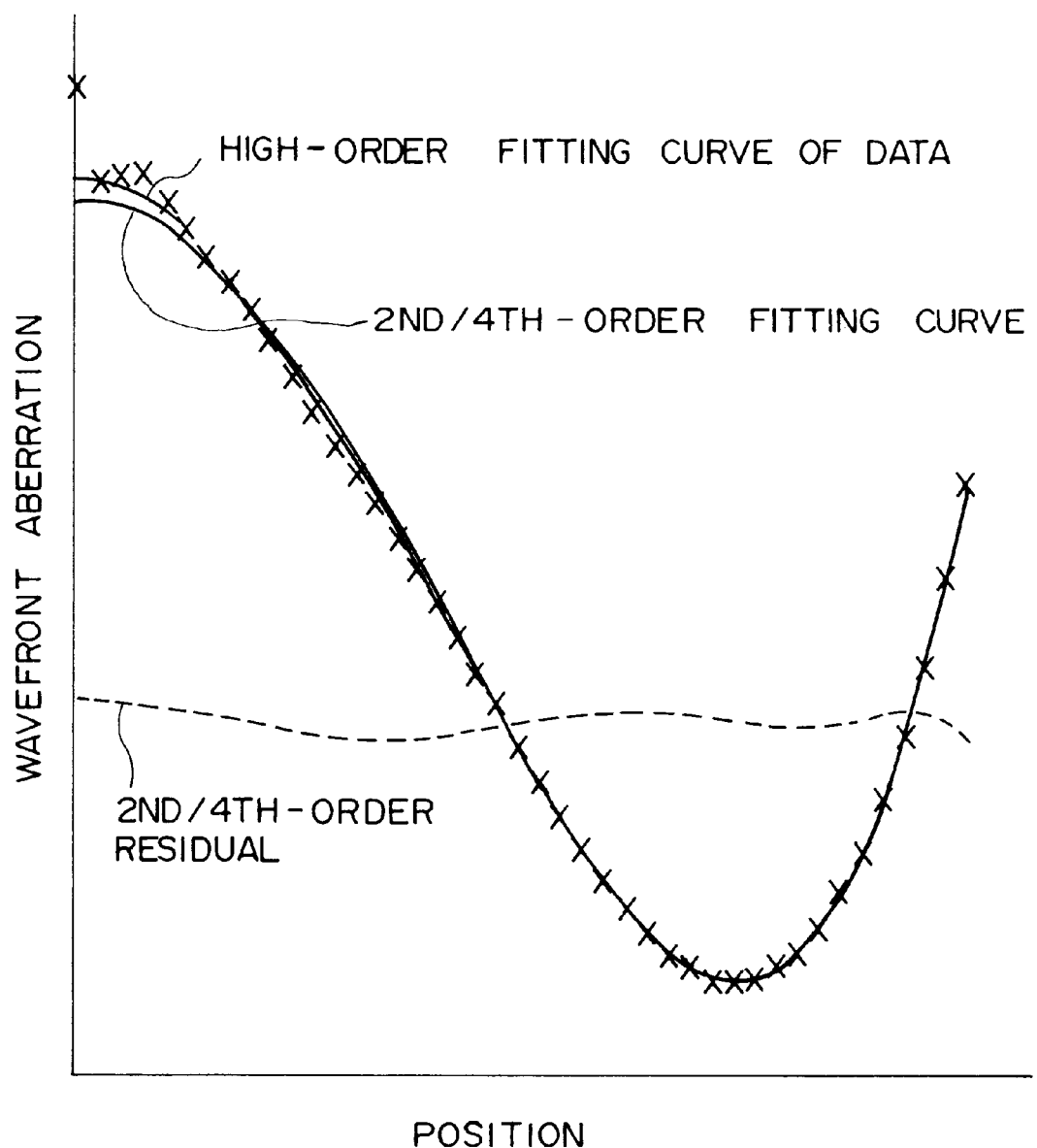
FIG. 23 is a graph showing the fitting result for the result shown in FIGS. 17 and 18 using a 2nd/4th-order curve.

In this manner, by precisely controlling the synthesis conditions (the burner structure, the gas flow rates, the oscillation pattern of the target, and the like) by the direct method, the ingot was synthesized. Disk-shaped test pieces Furthermore, 2nd/4th-order fitting was performed for the rotationally symmetric element to calculate a residual (FIG. 23).

$$RMS=0.0003\lambda$$

In this manner, although Δn exhibited a value exceeding $2\times10^{-6}$, an optical member having a random element and a 2nd/4th-order residual, which were equal to or smaller than the prescribed values, could be obtained.

TABLE 1

|  | Result 1 | Result 2 | Result 3 | Result 4 Rotary Symmetry | Result 4 Non-rotary Symmetry | Result 5 |
|---|---|---|---|---|---|---|
| RMS | 0.0559λ | 0.0073λ | 0.0069λ | 0.0058λ | 0.0017λ | 0.0003λ |
| PV | 0.1925λ | 0.0388λ | 0.0335λ | 0.0256λ | 0.0158λ | 0.0011λ |
| Power | 0.0000λ | −0.4431λ | −0.4431λ |  |  |  |
| X-tilt | −0.1124λ | −0.1771λ | −0.1771λ |  |  |  |
| Y-tilt | −0.1096λ | −0.1412λ | −0.1412λ |  |  |  |
| Contour Line Interval | 0.0100λ | 0.0100λ | 0.0100λ | 0.0100λ | 0.0100λ |  |
| Astigmatic |  |  | 0.0124λ |  |  |  | were horizontally cut from the obtained ingot (Φ=200 mm, L=800 mm) to match with the center of rotation of the ingot.

In order to remove distortion and to adjust homogeneity, the member was set at the center of an annealing furnace having a temperature distribution symmetrical about the center of the furnace, and was subjected to annealing (the member was held at 1,000° C. for 24 hours, cooled to 500° C. at 10° C./min, and thereafter, left to stand to cool).

Furthermore, a cylindrical member was extracted from the center using a core drill while maintaining the geometric central portion determined based on the outer shape of the ingot, thus obtaining a silica glass member (Φ=165 mm, t=50 mm).

Since it was very difficult to directly measure the tilt element of the refractive index using an interferometer, two prism-shaped test pieces were obtained from the two ends, in the radial direction, of this member, and the refractive indices of these pieces were measured with a precision on the $10^{-7}$ order by a minimum deflection angle method using a high-precision spectrometer. As a result, the difference between the refractive indices of these two test pieces was equal to or smaller than the measurement limit, i.e., the tilt element was $10^{-7}$ or less.

Figure 13:
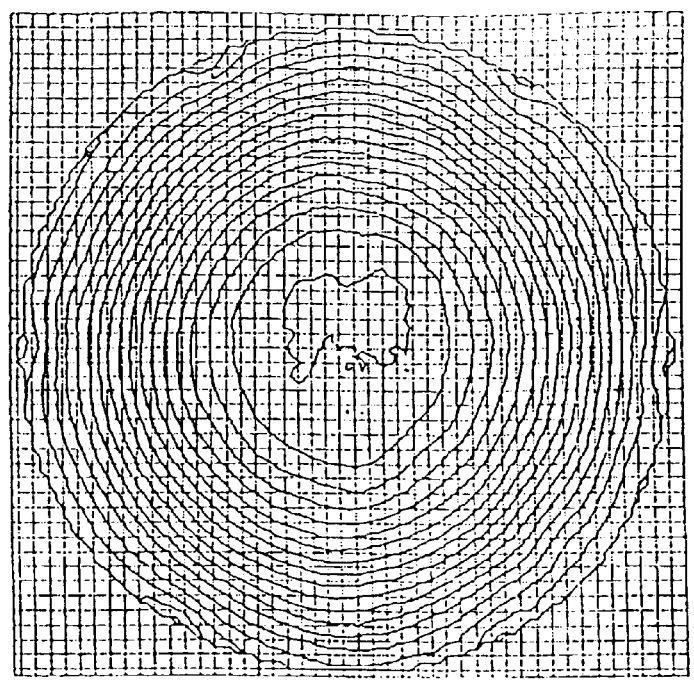
FIGS. 13 and 14 are charts showing the measurement result of an interferometer according to the first embodiment.
Figure 14:
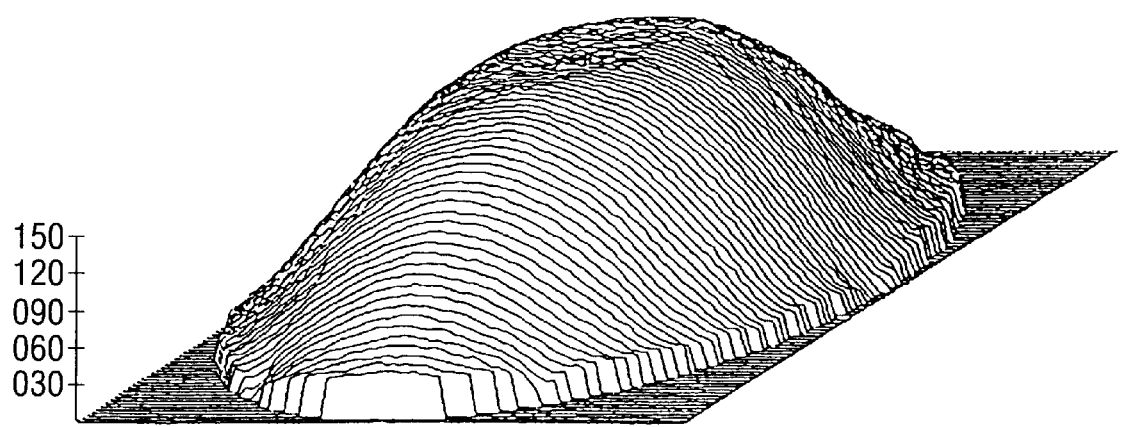

Thereafter, the homogeneity was measured by the oil on-plate method using an He—Ne laser interferometer, and a result of PV=0.1925λ was obtained (FIGS. 13 and 14).

Therefore, $$\Delta n=0.1925\times632.8\times10^{-6}/50=2.44\times10^{-6}$$

Figure 15:
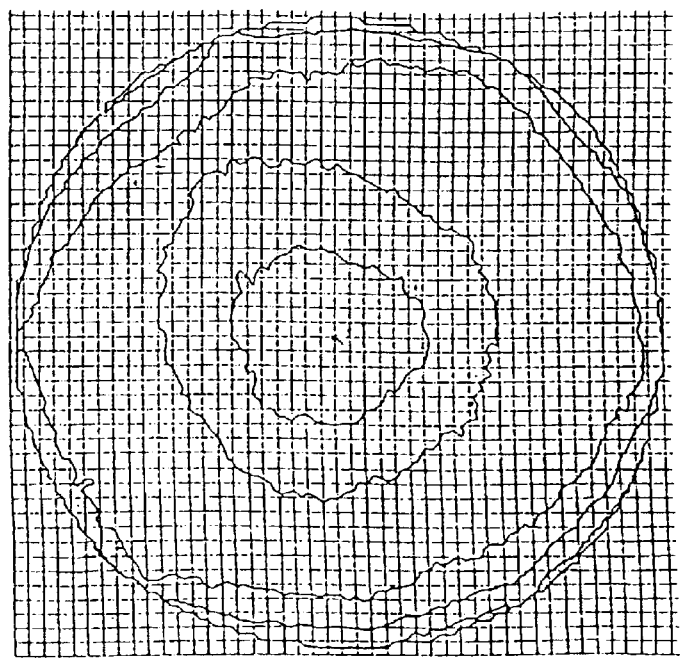
FIGS. 15 and 16 are charts showing the result after a power element is corrected from the result shown in FIGS. 13 and 14.
Figure 16:
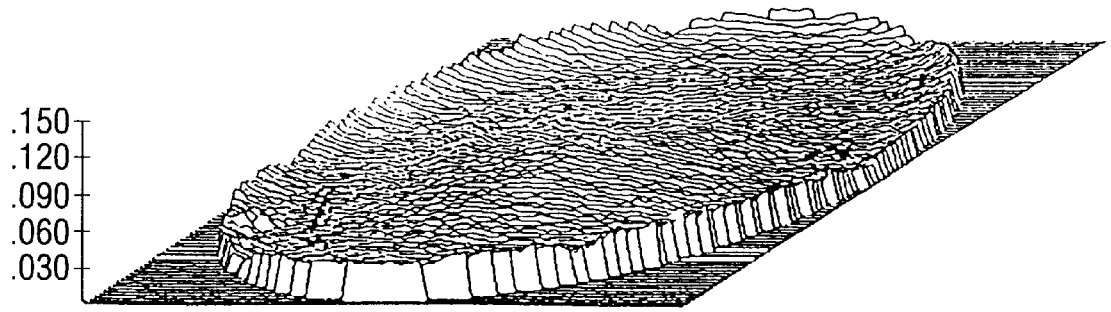
Figure 17:
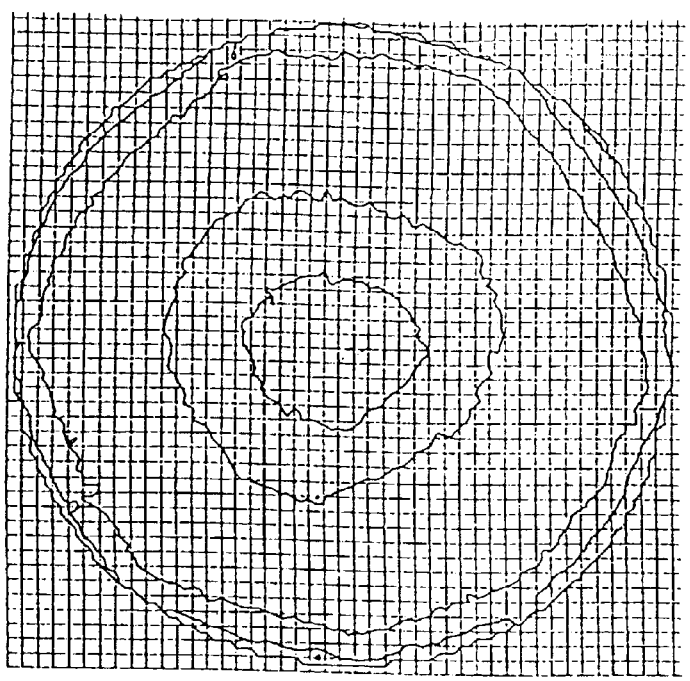
FIGS. 17 and 18 are charts showing the result after an astigmatic element is corrected from the result shown in FIGS. 15 and 16.
Figure 18:
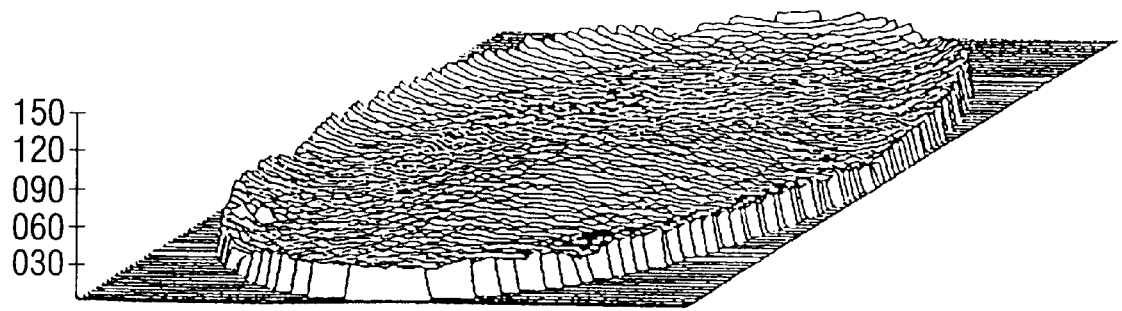
Figure 19:
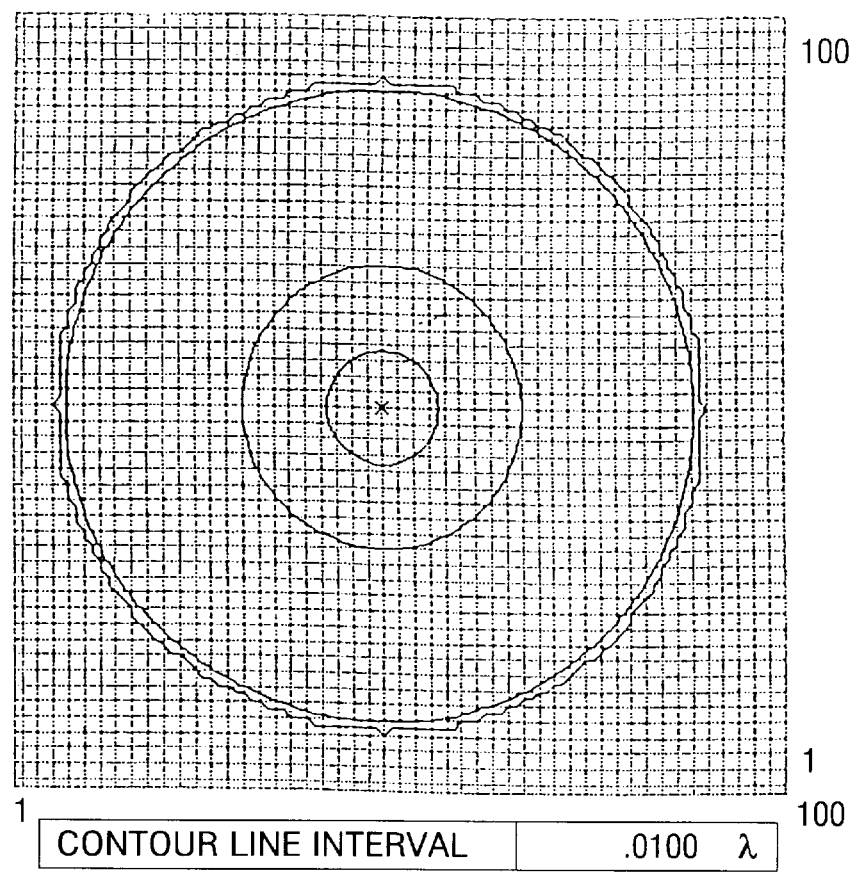
FIGS. 19 and 20 are charts showing a rotationally symmetric element after respective elements are separated from the result shown in FIGS. 17 and 18.
Figure 20:
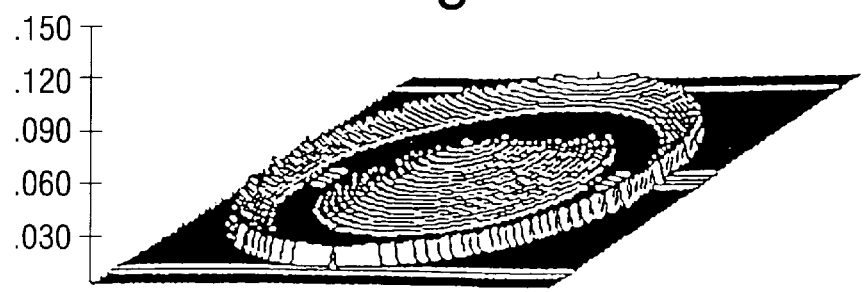
Figure 21:
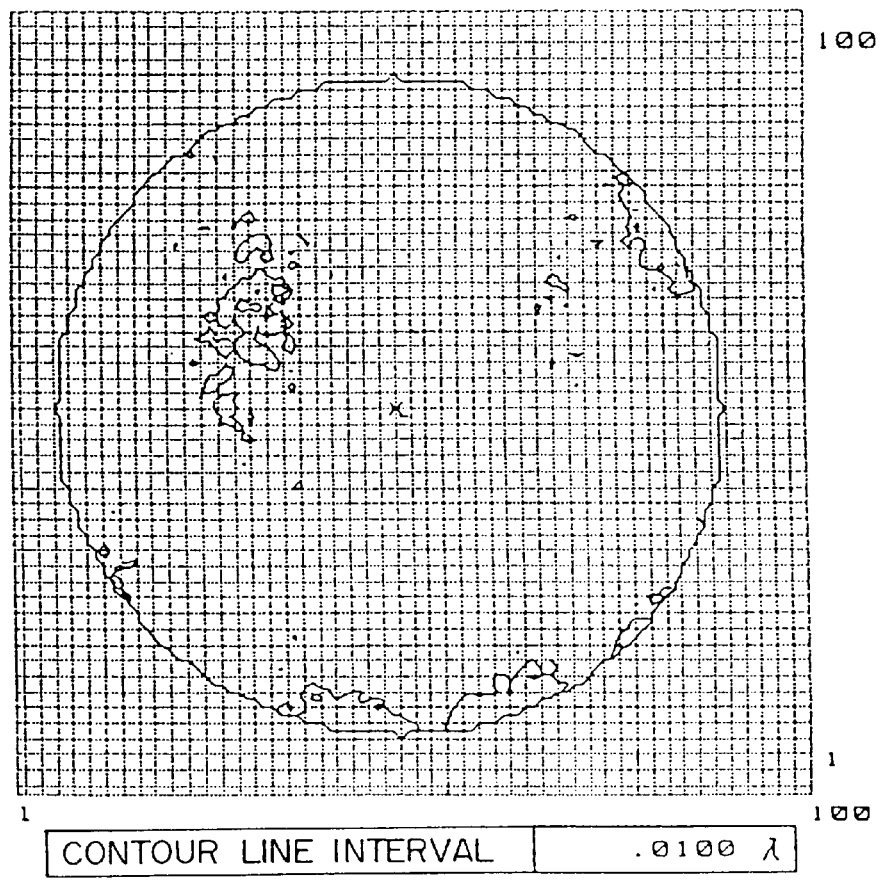
FIGS. 21 and 22 are charts showing a non-rotationally symmetric element after respective elements are separated from the result shown in FIGS. 17 and 18.
Figure 22:
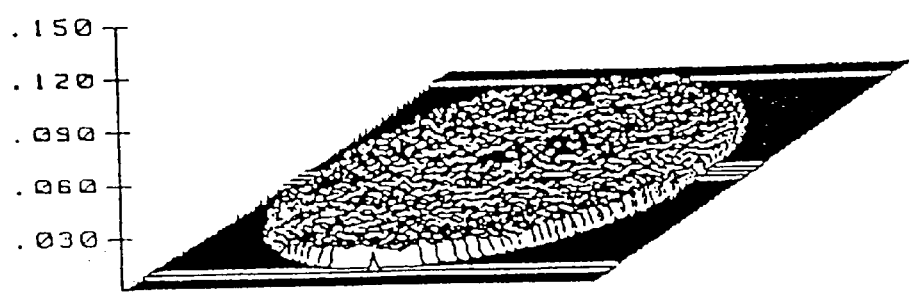

The power and tilt elements were corrected (FIGS. 15 and 16), the astigmatic element was corrected (FIGS. 17 and 18), and the rotationally symmetric element (FIGS. 19 and 20) and non-rotationally symmetric element (FIGS. 21 and 22) were separated.

The RMS value of the non-rotationally symmetric element (random element) was RMS=0.0017λ.

Figure 1:
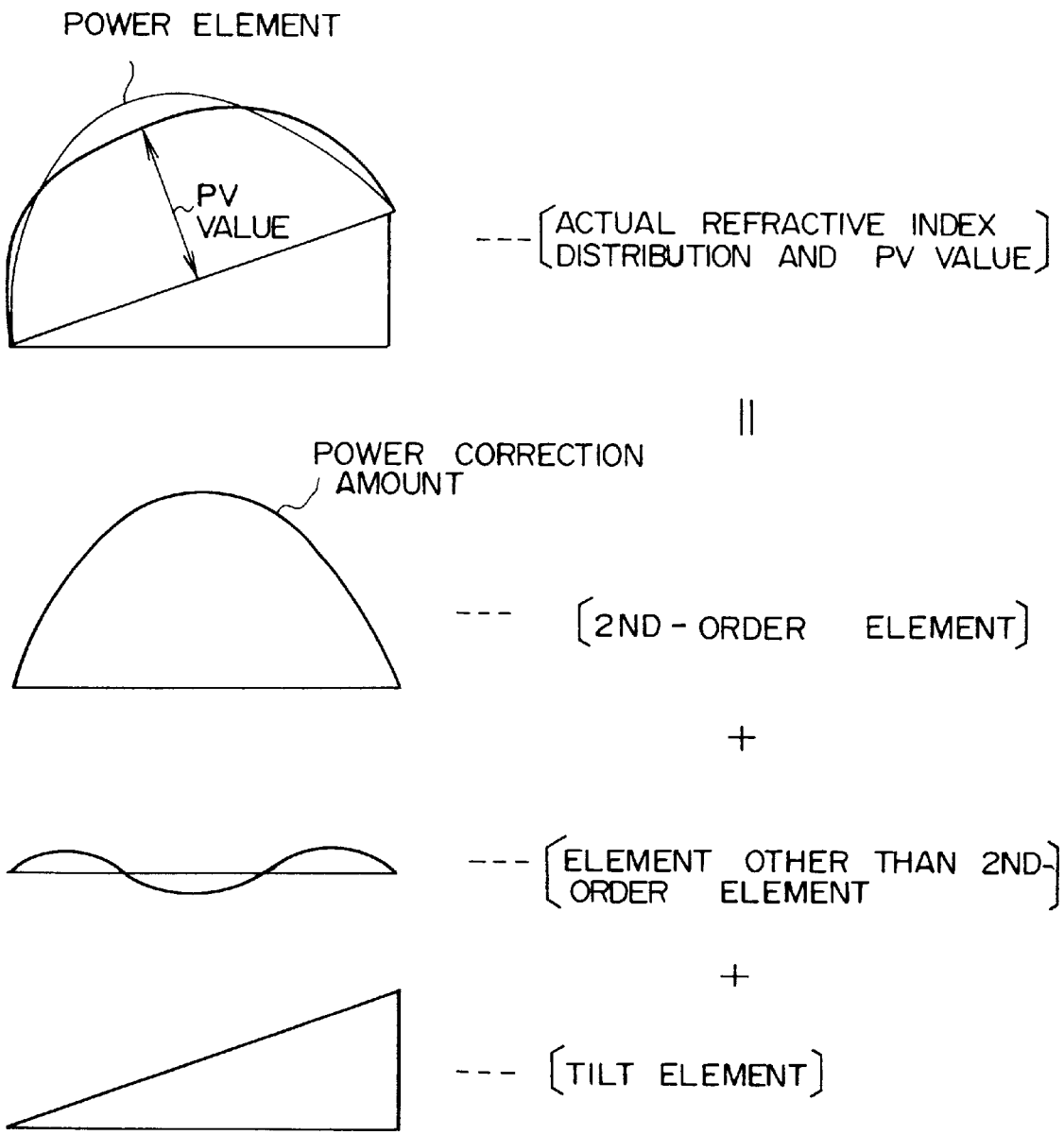
FIG. 1 shows various elements of the refractive index distribution of an optical member.
Figure 2:
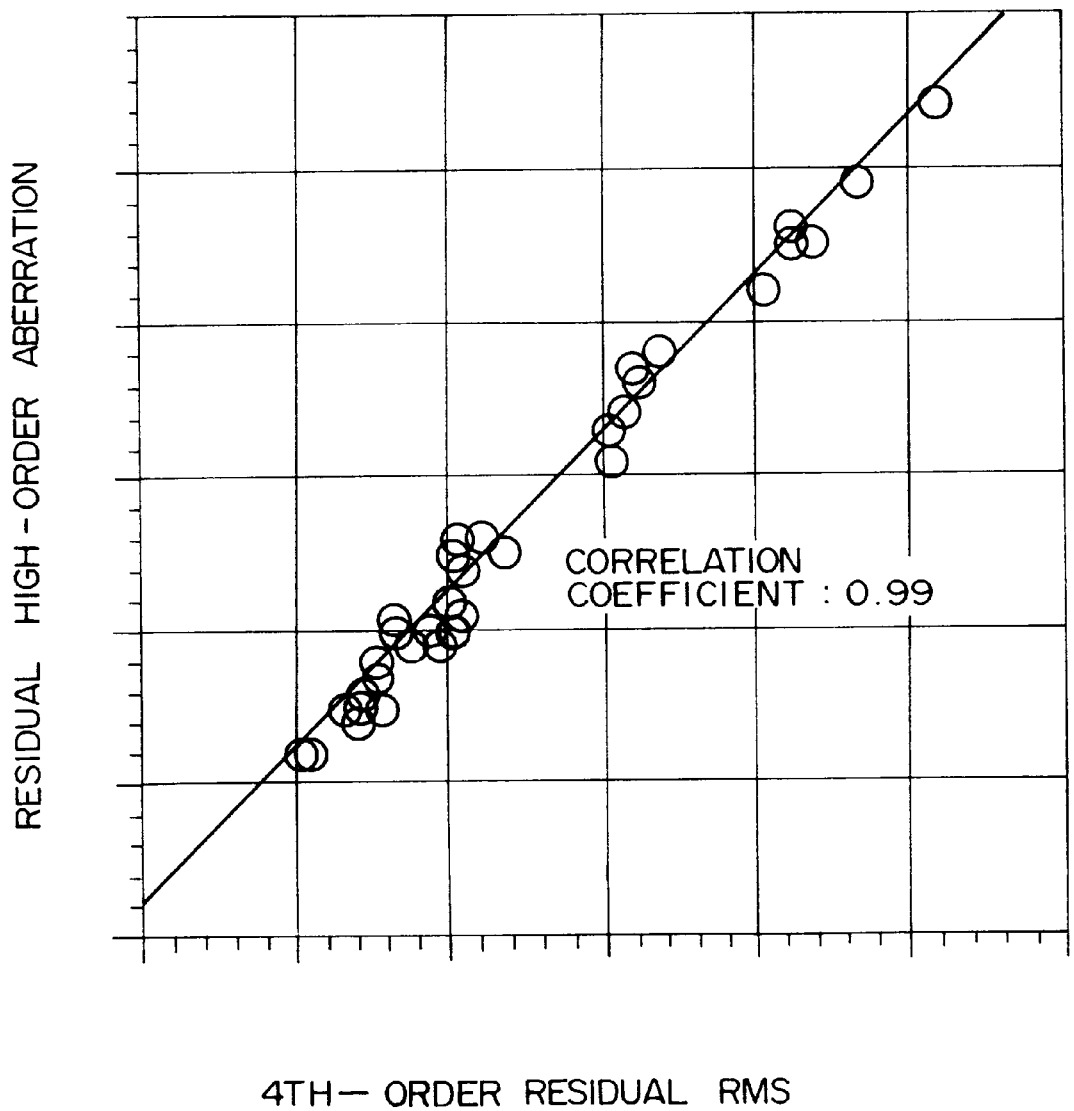
FIG. 2 is a diagram showing correlation between 2nd/4th-order residual RMS and residual high-order aberration.
Figure 3:
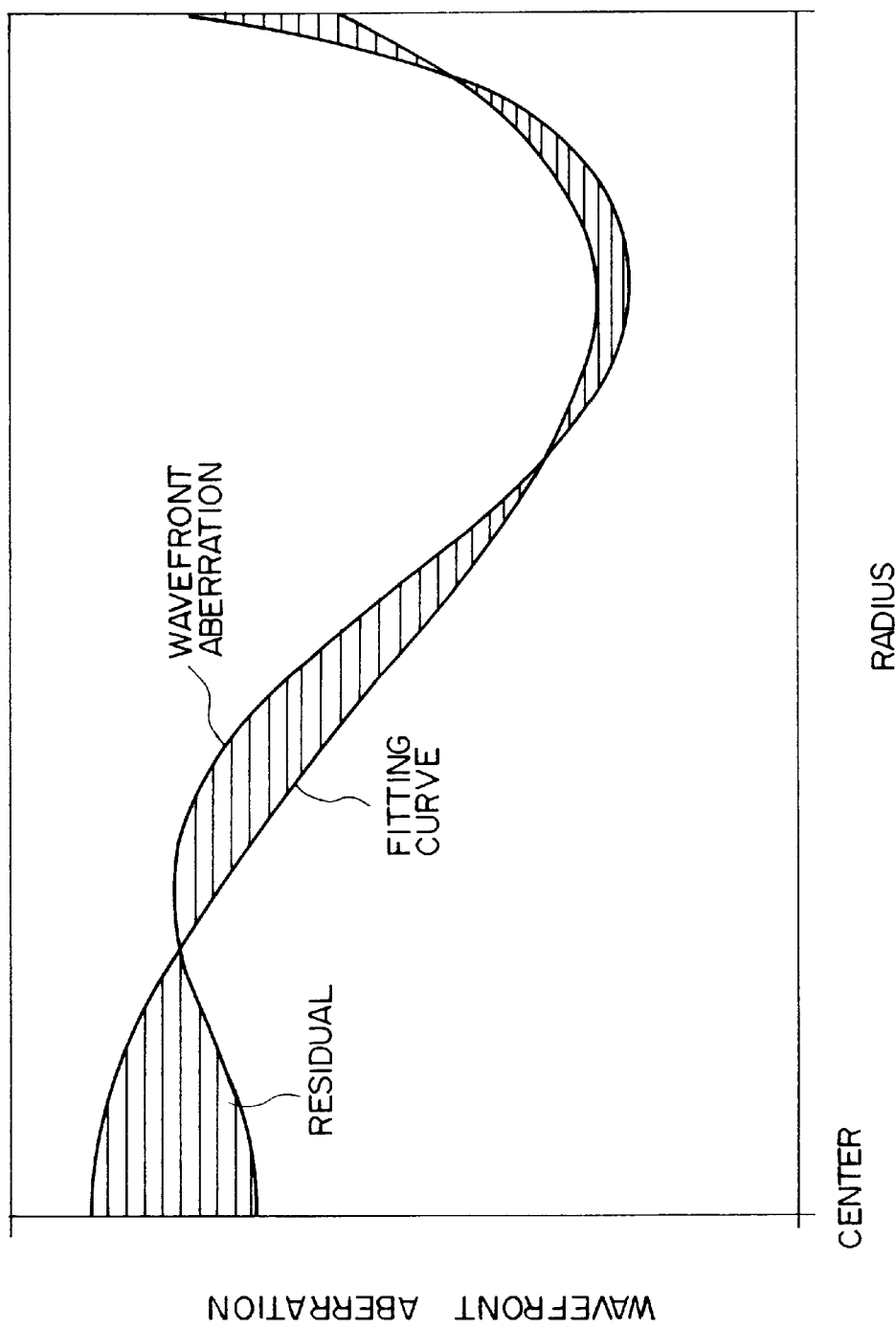
FIG. 3 is a graph showing the principle of correction of wavefront aberration using a 2nd/4th-order function according to the present invention.
Figure 4:
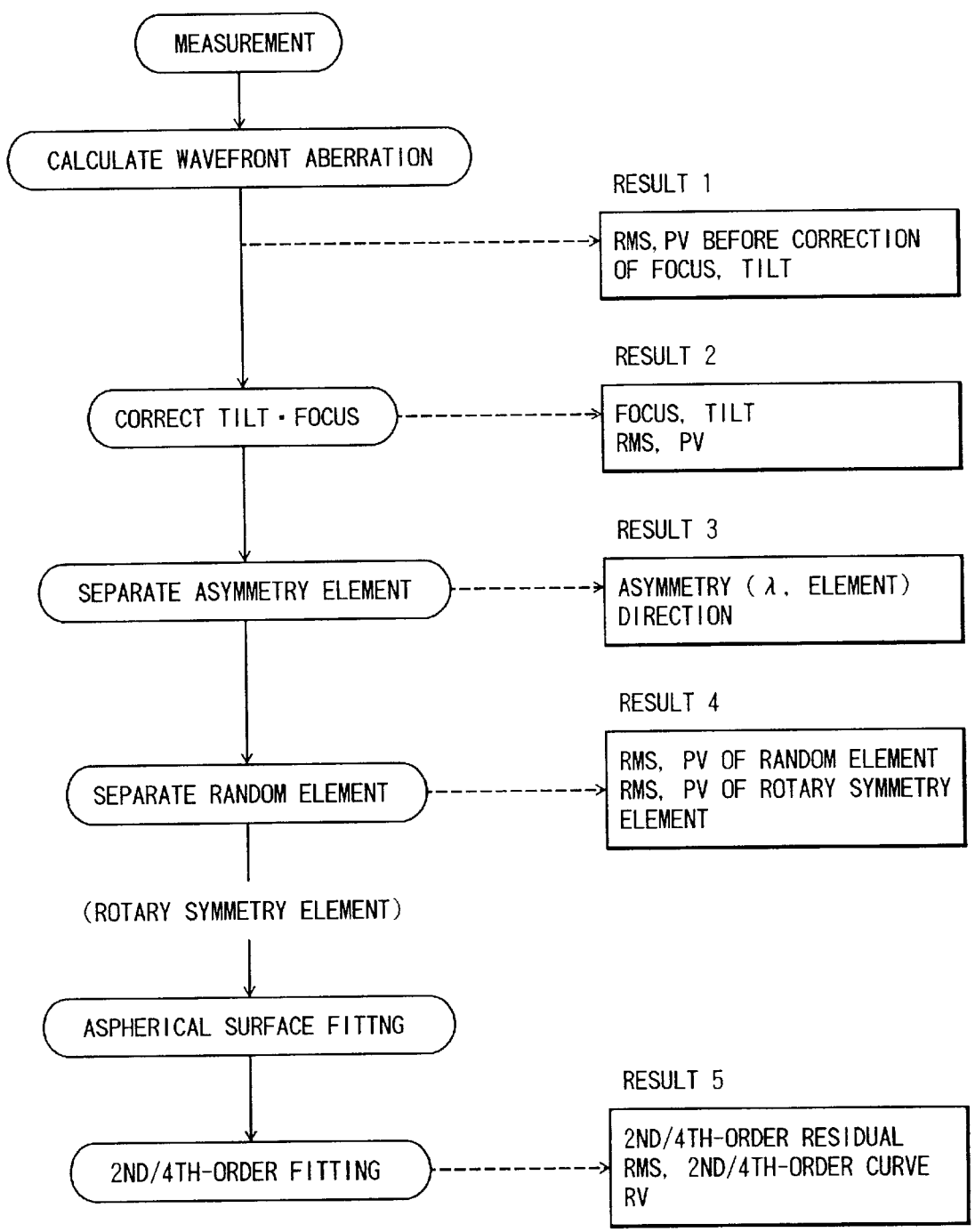
FIG. 4 is a flow chart showing the flow of data processing upon evaluation of homogeneity according to the present invention.
Figure 5:
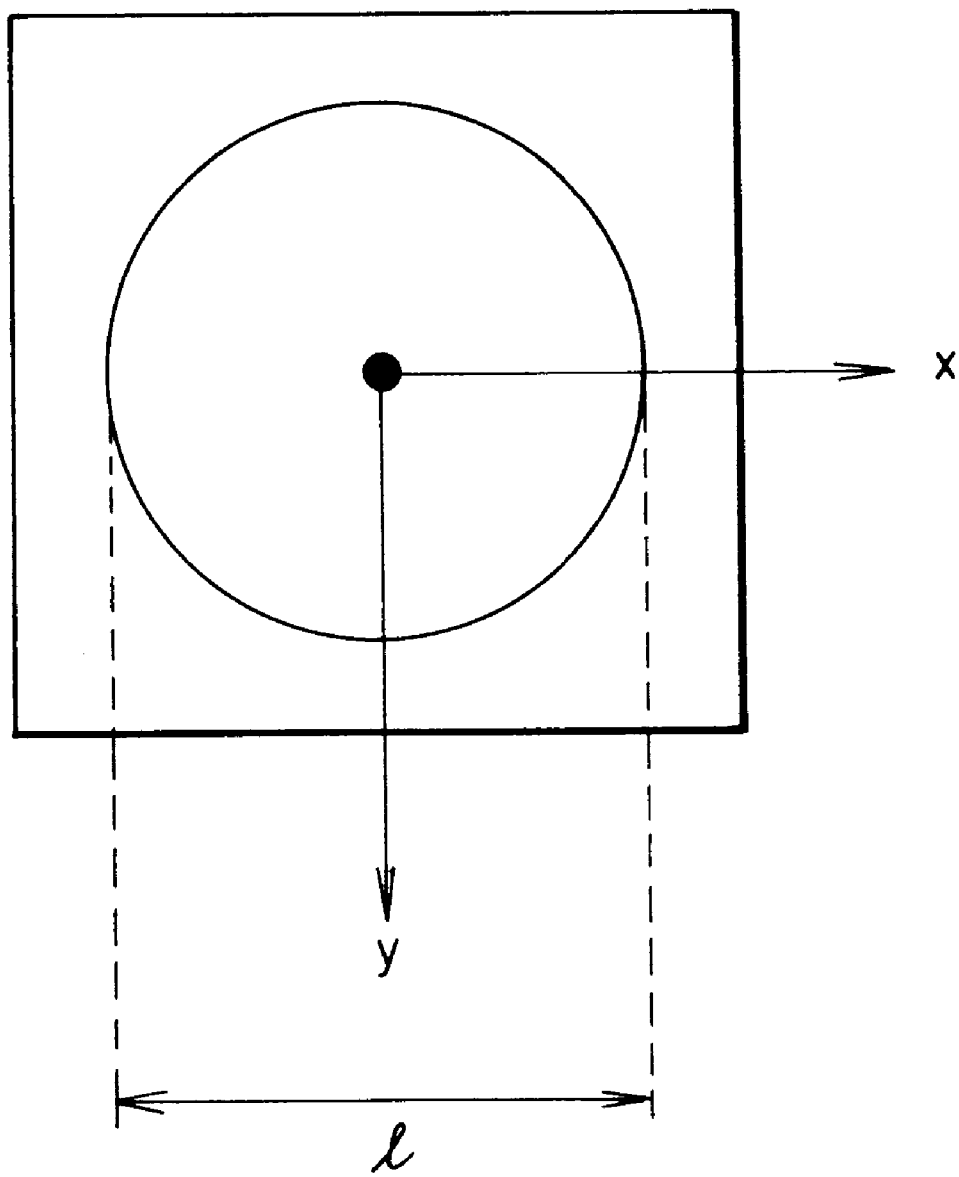
FIG. 5 is a view showing acquired aberration data.
Figure 6:
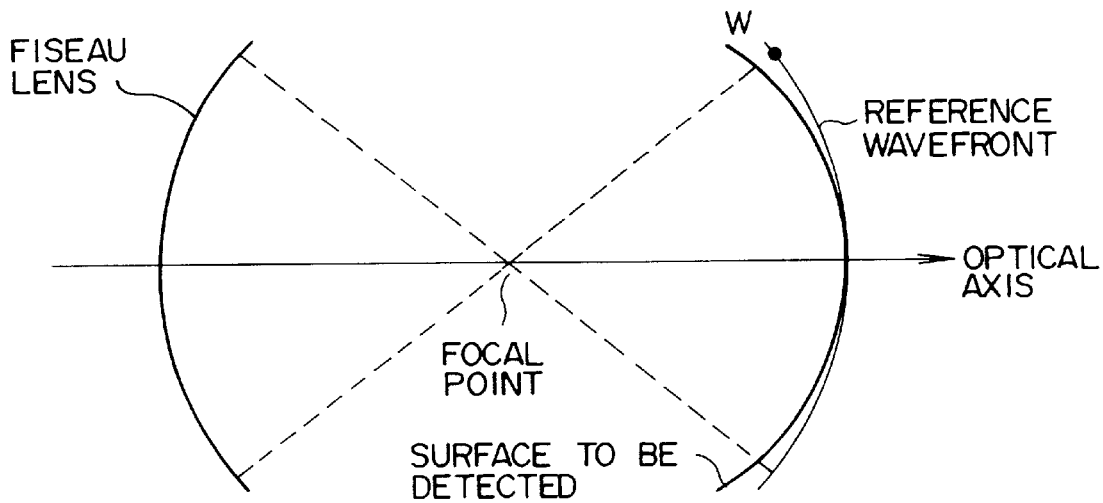
FIG. 6 is a view showing a focus element.
Figure 7:
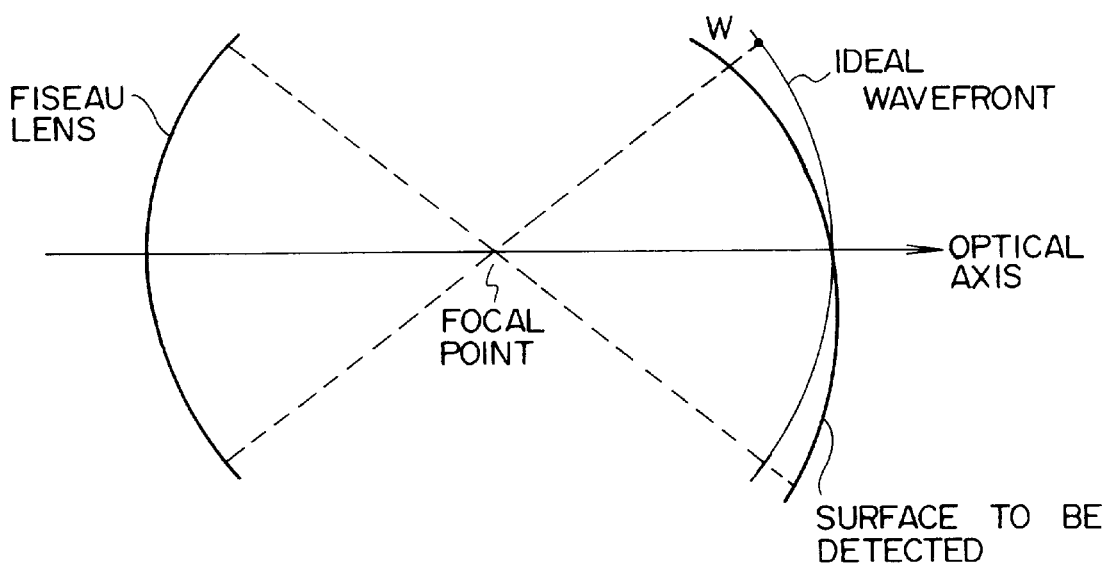
FIG. 7 is a view showing a tilt element.
Figure 8:
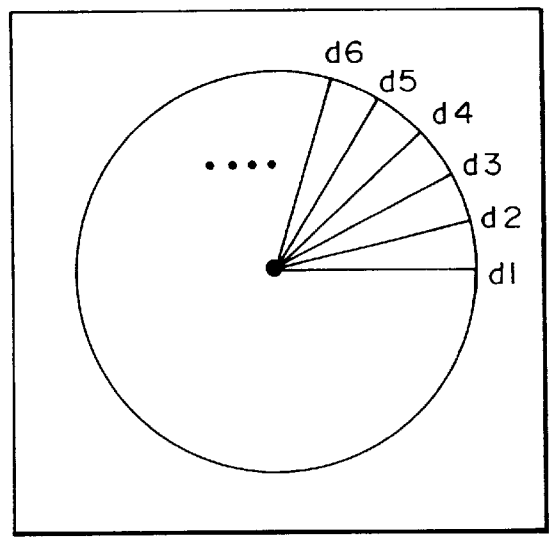
FIGS. 8 and 9 are conceptual views showing the principle of calculation of a rotationally symmetric element by the division method.
Figure 9:
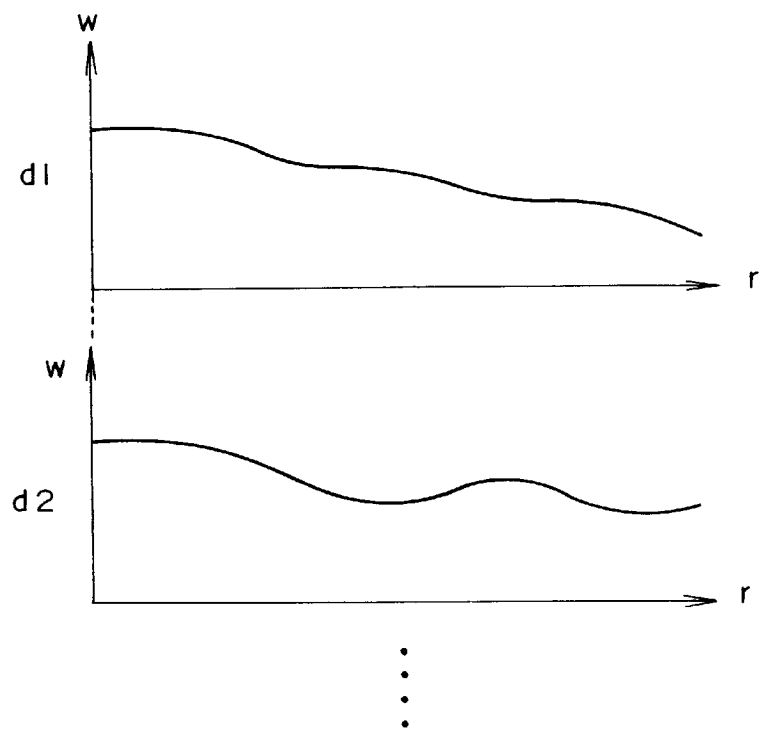
Figure 10:
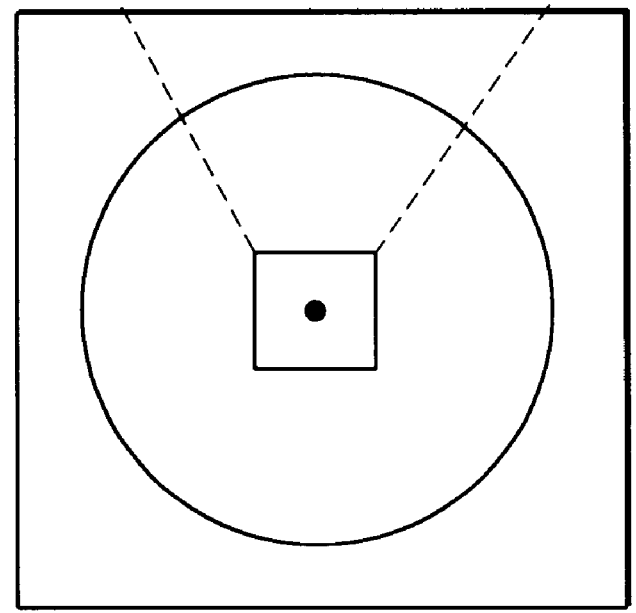
FIG. 10 is a conceptual view showing the principle of calculation of a rotationally symmetric element by the non-division method.
Figure 11:
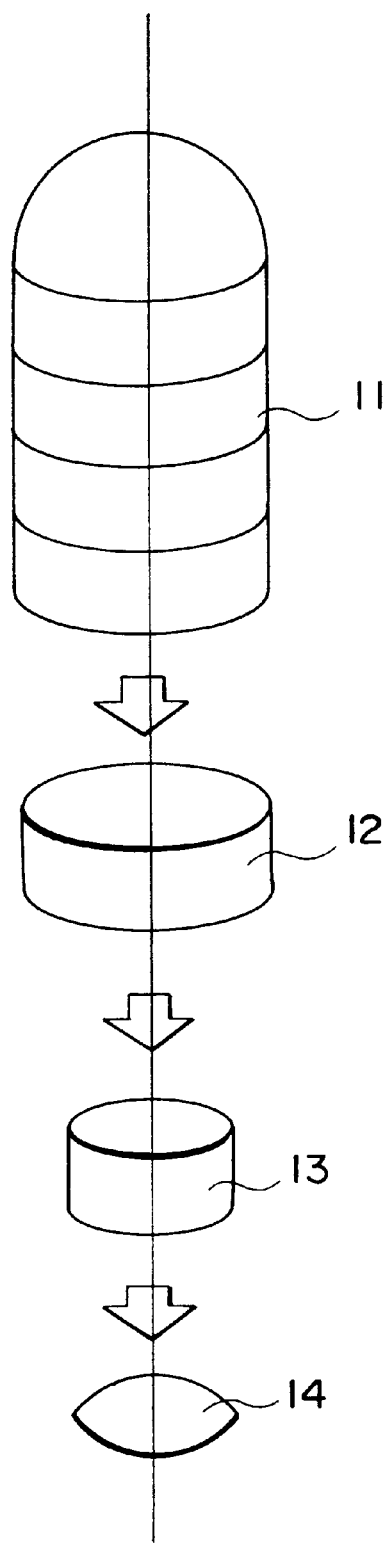
FIG. 11 is a schematic view showing the manufacturing procedure of lithography silica glass according to the present invention.
Figure 12:
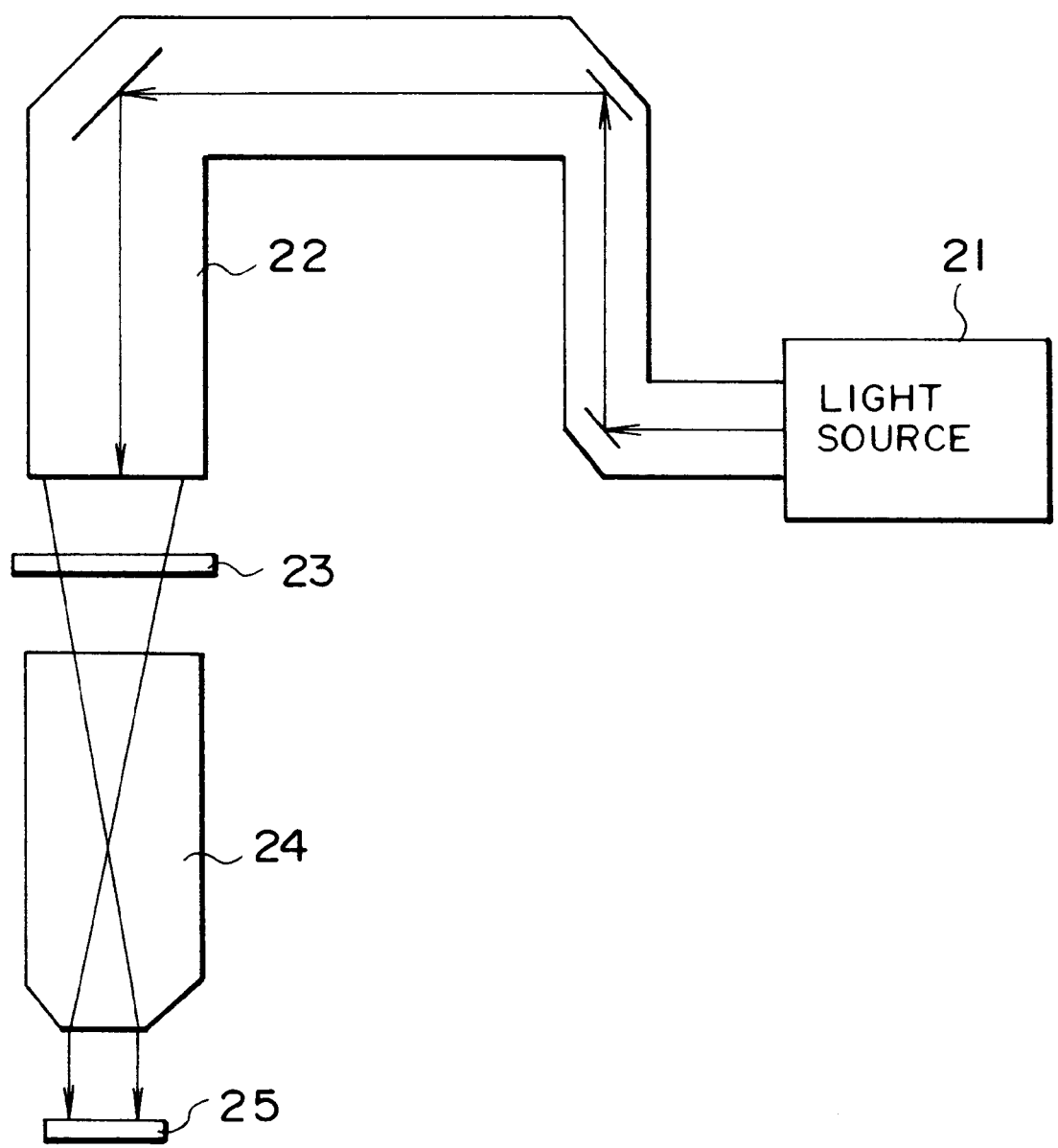
FIG. 12 is a schematic view showing a lithography apparatus which uses a projection lens system manufactured using an optical member according to the present invention.

When this silica glass member was worked into a shape shown in FIG. 11 to manufacture a projection lens system shown in FIG. 12, it was confirmed that the lens system satisfied required design performance. A system using this lens had a resolution defined by a line width of about 0.3 μm. An integrated circuit pattern had a line width of about 0.3 μm, and practically sufficient flatness could be obtained by the system.

Reference Example

Following the same method as in the first embodiment, synthesis and working were performed under conditions for preferentially decreasing Δn.

Figure 24:
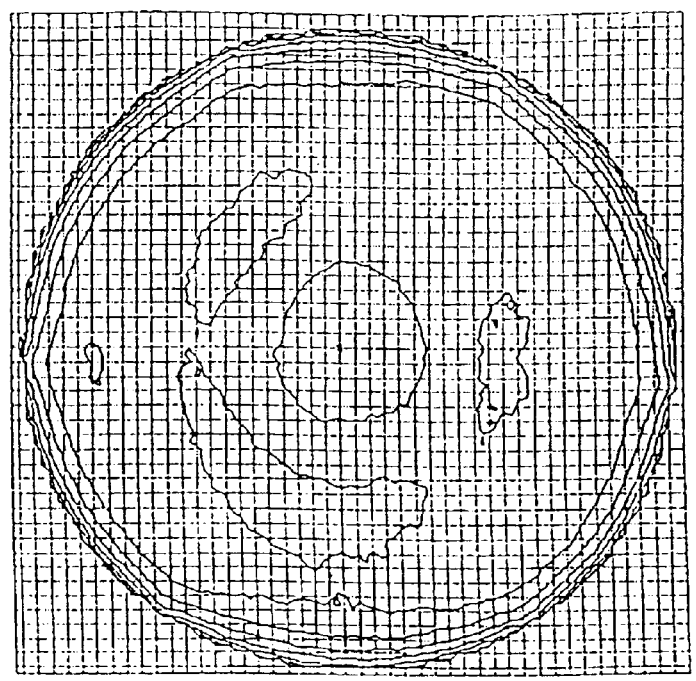
FIGS. 24 and 25 are charts showing the measurement result of an interferometer according to the reference example.
Figure 25:
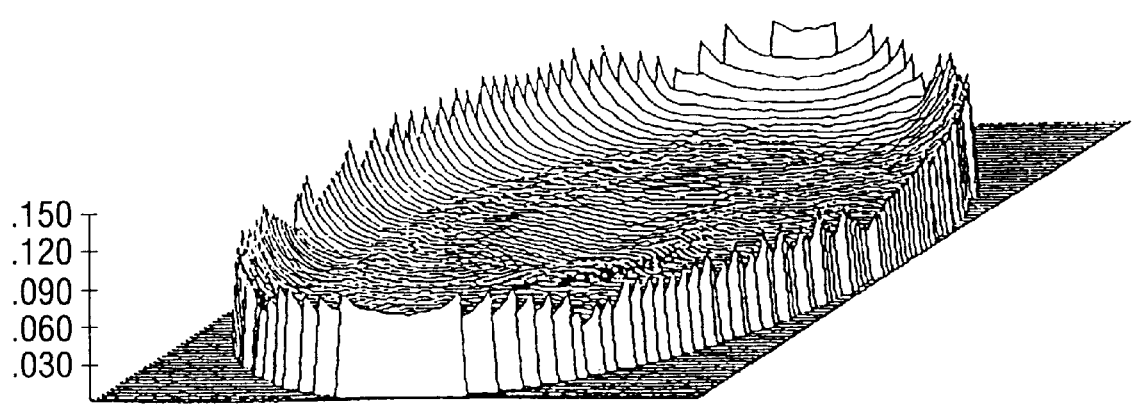

After a silica glass member (Φ=165 mm, t=50 mm) was obtained, the homogeneity was measured by the oil on-plate method using an He—Ne laser interferometer, and a result of PV=0.0889λ was obtained (FIGS. 24 and 25).

Therefore, $$\Delta n=0.0889\times632.8\times10^{-6}/50=1.13\times10^{-6}$$

Figure 26:
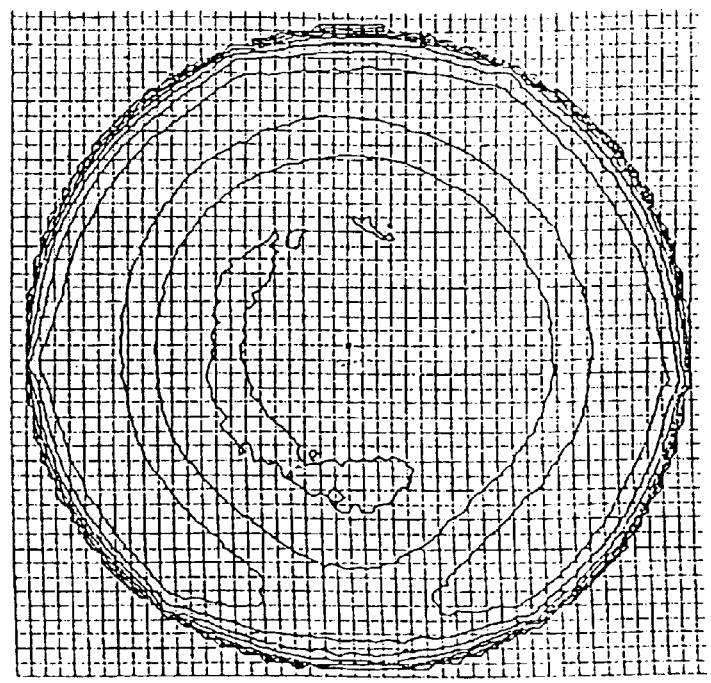
FIGS. 26 and 27 are charts showing the result after a power element is corrected from the result shown in FIGS. 24 and 25.
Figure 27:
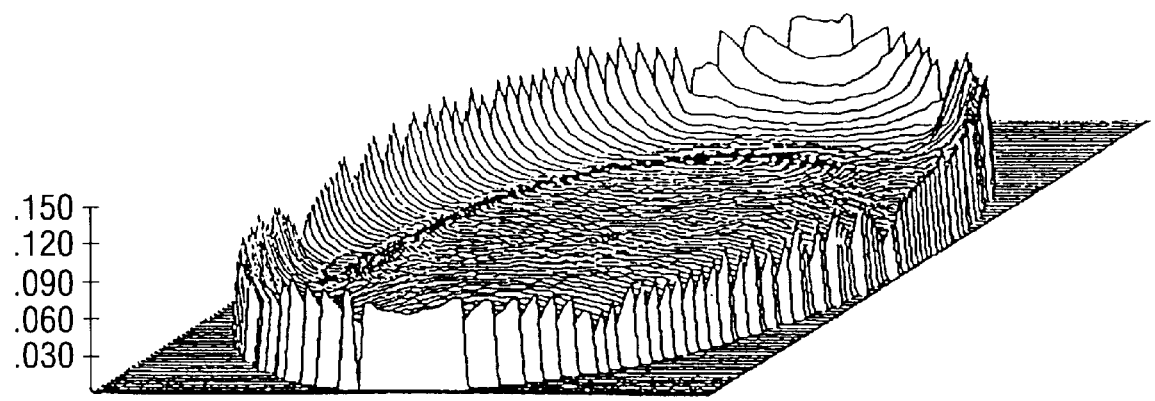
Figure 28:
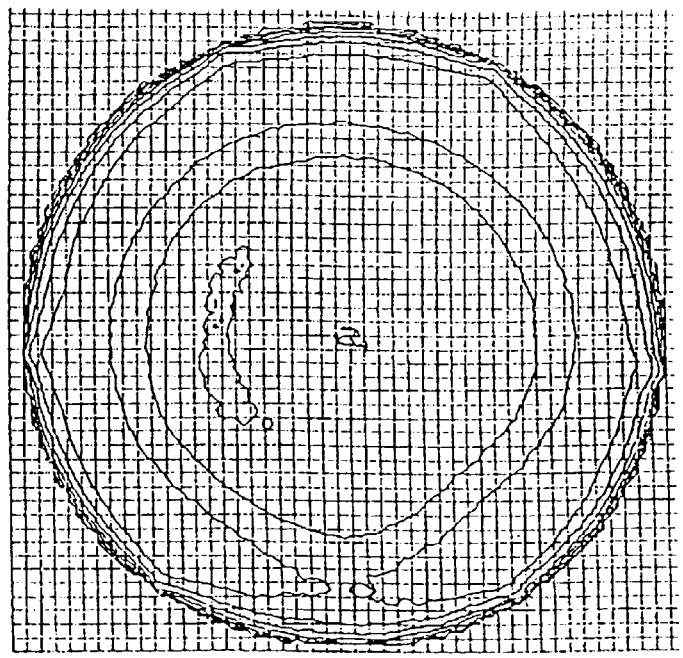
FIGS. 28 and 29 are charts showing the result after an astigmatic element is corrected from the result shown in FIGS. 26 and 27.
Figure 29:
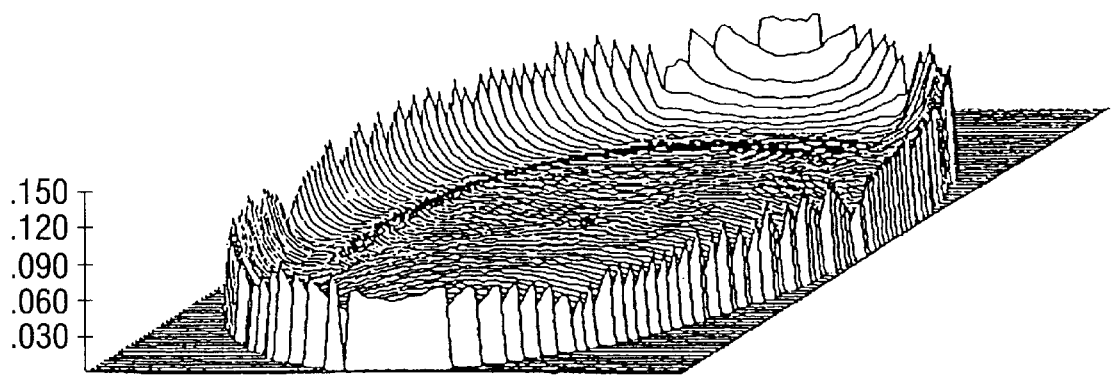
Figure 30:
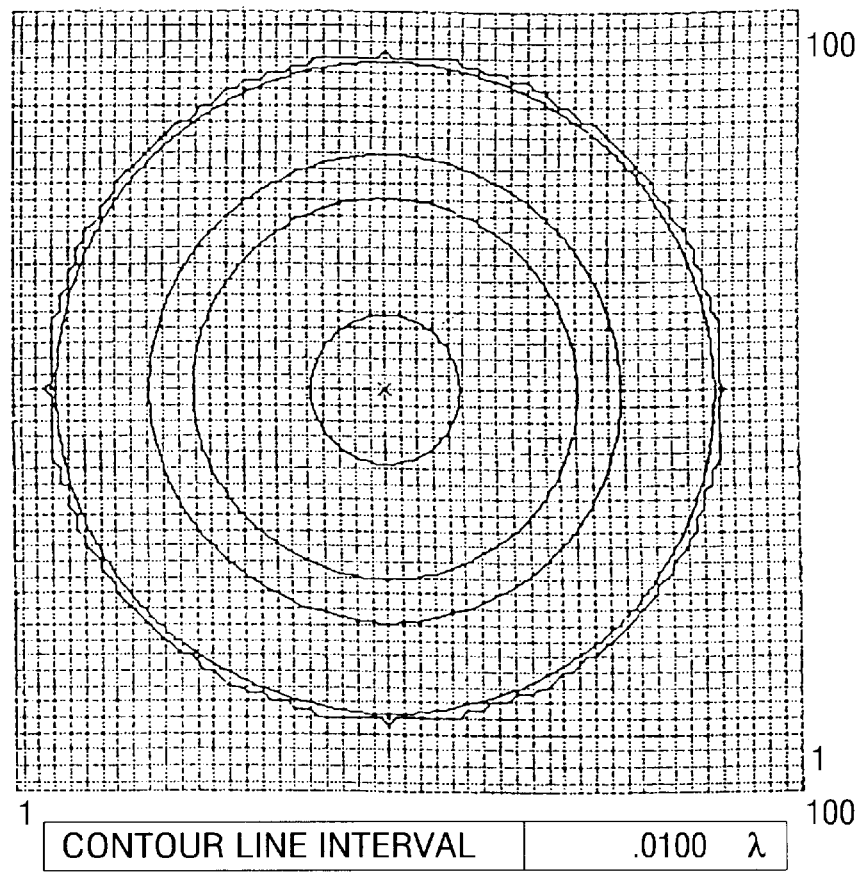
FIGS. 30 and 31 are charts showing a rotationally symmetric element after respective elements are separated from the result shown in FIGS. 28 and 29.
Figure 31:
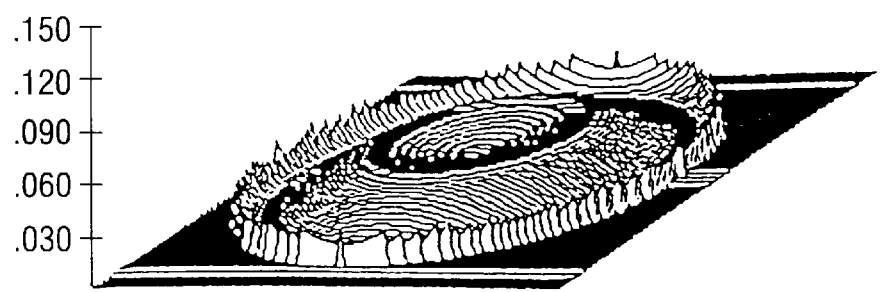
Figure 32:
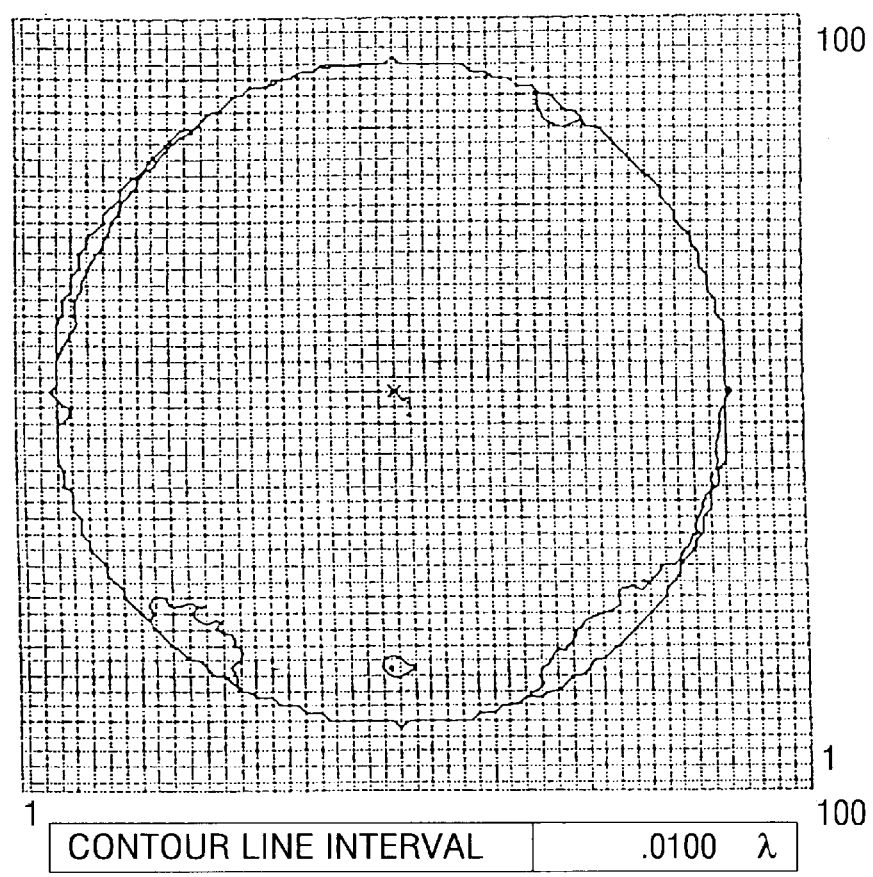
FIGS. 32 and 33 are charts showing a non-rotationally symmetric element after respective elements are separated from the result shown in FIGS. 28 and 29.
Figure 33:
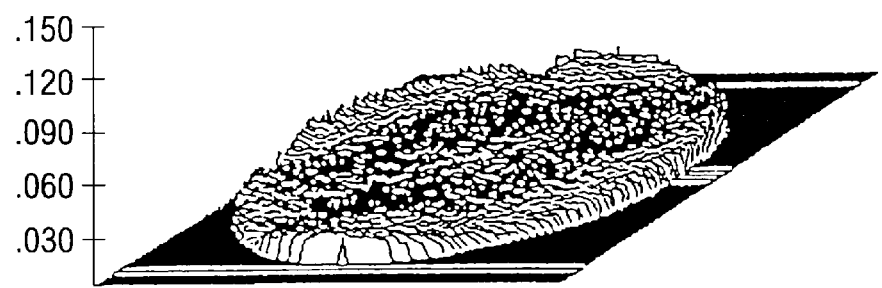

The power and tilt elements were corrected (FIGS. 26 and 27), the astigmatic element was corrected (FIGS. 28 and 29), and the rotationally symmetric element (FIGS. 30 and 31) and non-rotationally symmetric element (FIGS. 32 and 33) were separated.

The RMS value of the non-rotationally symmetric element (random element) was RMS=0.0042λ.

Figure 34:
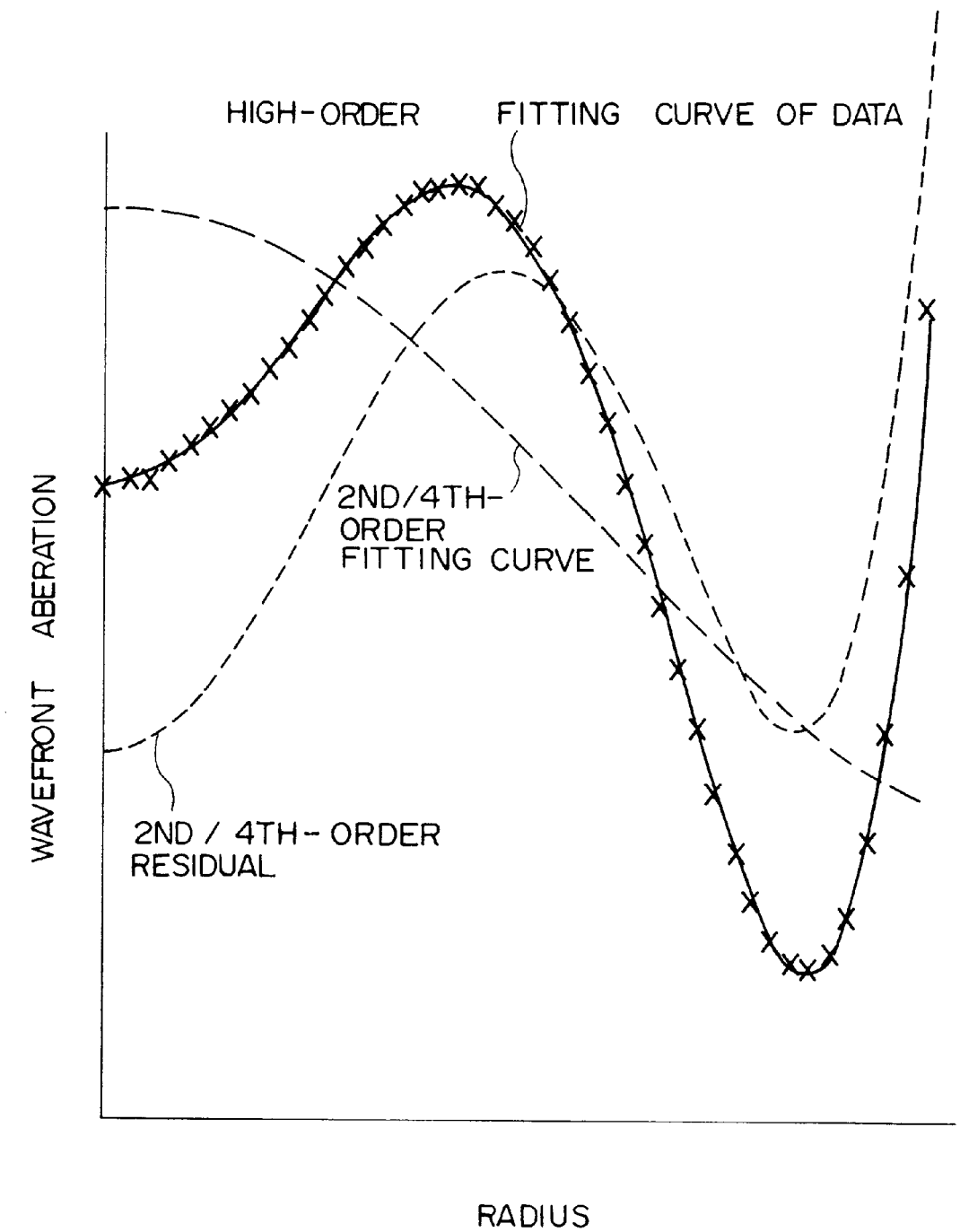
FIG. 34 is a graph showing the fitting result for the result shown in FIGS. 30 and 31 using a 2nd/4th-order curve.

Furthermore, 2nd/4th-order fitting was performed for the rotationally symmetric element to calculate a residual (FIG. 34).

$$RMS=0.0056\lambda$$

In this manner, although Δn exhibited a satisfactory value of $1.13\times10^{-6}$, an optical member which satisfied the prescribed values of both the random element and the 2nd/4th-order residual could not be obtained.

TABLE 2

| | Result 1 | Result 2 | Result 3 | Result 4 Rotary Symmetry | Result 4 Non-rotary Symmetry | Result 5 |
|---|---|---|---|---|---|---|
| RMS | 0.0161λ | 0.0160λ | 0.0140λ | 0.0087λ | 0.0042λ | 0.0056λ |
| PV | 0.0899λ | 0.0891λ | 0.0880λ | 0.0247λ | 0.0255λ | 0.0235λ |
| Power | 0.0000λ | 0.0471λ | 0.0471λ | | | |
| X-tilt | −0.0928λ | −0.0924λ | −0.0924λ | | | |
| Y-tilt | −0.1626λ | −0.1800λ | −0.1800λ | | | |
| Contour Line Interval | 0.0100λ | 0.0100λ | 0.0100λ | 0.0100λ | 0.0100λ | |
| Astigmatic | | | 0.0091λ | | | |

When a projection lens system shown in FIG. 12 was manufactured by working this silica glass member, as shown in FIG. 11, required design performance could not be satisfied.

Second Embodiment

Following the same method as in the first embodiment, synthesis and working were performed to obtain a silica glass member (Φ=240 mm, t=125 mm).

Figure 35:
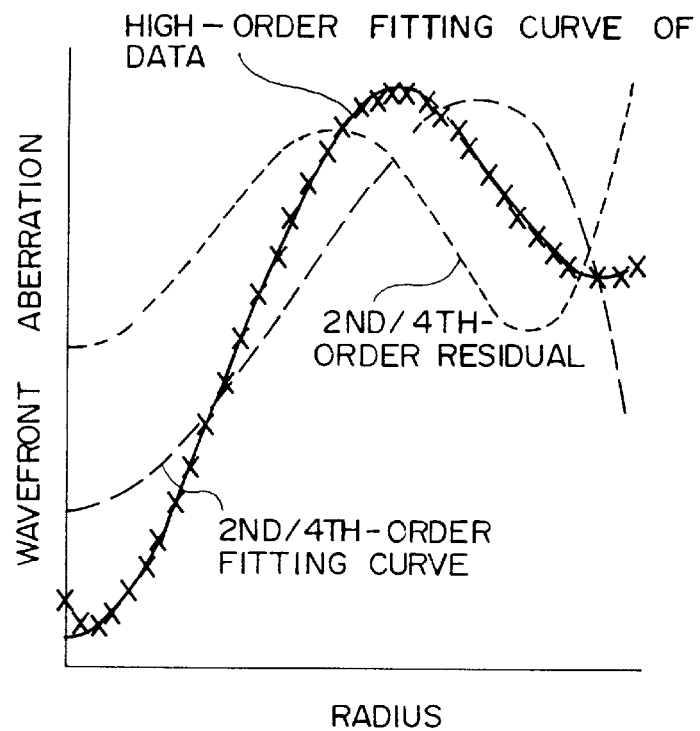
FIG. 35 is a graph showing the 2nd/4th-order residual RMS fitting result in the second embodiment.

Thereafter, the homogeneity was measured by the oil on-plate method using an He—Ne laser interferometer, and 2nd/4th-order fitting was performed for the rotationally symmetric element. As a result, the obtained wavefront aberration data had five peak values (FIG. 35 illustrates ½ the obtained data), and its residual was RMS=0.0179λ (FIG. 35). More specifically, the rotationally symmetric element distribution of an approximation curve of the obtained wavefront aberration data did not match a 2nd/4th-order correction curve at all. The peak value, closest to the center, of this rotationally symmetric element distribution was located at a position about 57% the radius.

When the outer diameter of the member is calculated, so that the peak value, closest to the center, of the rotationally symmetric element distribution of the approximate curve is located at a position about 70% the radius, we have:

240 mm×57/70=195 mm

When the member is worked to have the calculated outer diameter, it is expected from FIG. 35 that the number of peak values of the rotationally symmetric element distribution is reduced to three.

Figure 36:
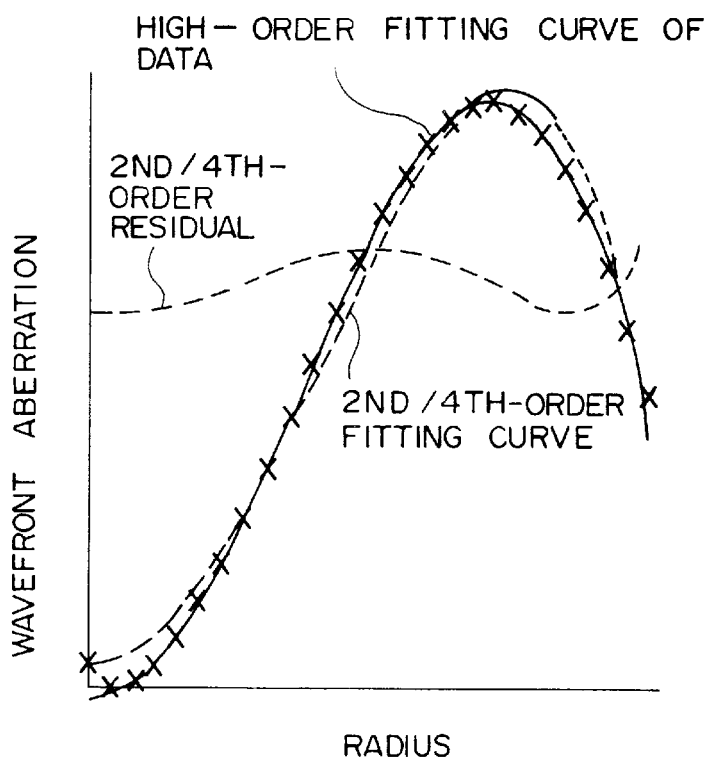
FIG. 36 is a graph showing the 2nd/4th-order residual RMS fitting result after a member of the third embodiment is subjected to rounding to an optimal diameter.

Thus, the member was subjected to rounding up to Φ=195 mm, and the same measurement was performed. As a result, the 2nd/4th-order residual for the rotationally symmetric element was greatly reduced to ⅕ or less, i.e., RMS= 0.0034λ, and very good matching with the 2nd/4th-order correction curve was observed (FIG. 36).

When a projection lens system shown in FIG. 12 was manufactured by working this silica glass member, as shown in FIG. 11, it was confirmed that required design performance was satisfied.

In this manner, an integrated circuit pattern which had a resolution defined by a line width of about 0.3 μm, and practically sufficient flatness could be obtained.

As described above, according to the present invention, an optical member which satisfied required optical performance can be provided without lowering the yield.

Furthermore, when a lens manufactured from a silica glass member which has a refractive index with a large tilt element or has an asymmetrical refractive index distribution about the optical axis is assembled in a projection lens system and is adjusted as an optical system, a very large number of adjustment steps are required. However, according to the present invention, the time required for adjustment can be greatly shortened.

Due to these factors, cost reduction of the photolithography apparatus can be realized.

When the silica glass member of the present invention is used in the photolithography technique, exposure and transfer can be performed using light in a specific wavelength region of 400 nm or less, and wafer alignment using, e.g., an He—Ne laser beam (632.8 nm) can also be performed.

The present invention has been discussed with reference to the homogeneity of the refractive index of an optical member, but the same evaluation may be performed upon measurement of the surface precision of a lens.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 6-134723 (134723/ 1994) filed on Jun. 16, 1994 is hereby incorporated by reference.

What is claimed is:

1. An optical member for light having a wavelength of not more than 400 nm, wherein OH group concentration distribution of said optical member is symmetrical with respect to an optical axis thereof, and wherein a root mean square value measured by the following measuring method is not more than 0.004 times a wavelength of a prove light, said measuring method comprising the steps of:

illuminating said optical member with said prove light having a wavelength of 633 nm along said optical axis thereof and measuring refractive indexes of said optical member in said optical axis;

fitting even-order polynomials including Zero-order polynomial to the measured refractive indexes by a least square method to minimize the differences between the fitted even-order polynomials and the measured refractive indexes; and calculating said root mean square value of the differences between the measured refractive indexes and the even-order polynomials.

2. An optical member for light having a wavelength of not more than 400 nm, wherein said optical member has a predetermined refractive index distribution in an optical axis thereof, a root mean square value of elements of high even orders in a rotationally symmetric element of wavefront aberration along said optical axis after eliminating 2nd and 4th-order elements from said rotationally symmetric element is not more than 0.005 times a wavelength of a prove light, and said wavefront aberration is caused by said predetermined refractive index distribution.

3. A photolithography apparatus for performing projection of a pattern image of a mask on a substrate, said apparatus comprising:

illumination optical system for illuminating said mask with a light having a wavelength of not more than 400 nm as an exposure light; and a projection optical system for forming said pattern image of said mask on said substrate, at least one of said illumination optical system and said projection optical system including the optical member according to claim 2.

4. An optical member for light having a wavelength of not more than 400 nm, wherein OH group concentration distribution of said optical member is symmetrical with respect to an optical axis thereof, and wherein a root mean square value measured by the following measuring method is not more than 0.005 times a wavelength of a prove light, said measuring method comprising the steps of:

illuminating said optical member with said prove light having a wavelength of 633 nm along said optical axis thereof and measuring refractive indexes of said optical member in said optical axis;

fitting even-order polynomials including Zero-order polynomial to the measured refractive indexes by a least square method to minimize the differences between the fitted even-order polynomials and the measured refractive indexes;

eliminating 2nd and 4th order elements of said even-order polynomials obtained in said fitting step from rotationally symmetric elements of wavefront aberration to derive high even order polynomials; and calculating said root mean square value in said high even order polynomials.

5. An optical member for light having a wavelength of not more than 400 nm, wherein said optical member has a predetermined refractive index distribution in a optical axis thereof, and wherein PV value of 2nd and 4th elements in a rotationally symmetric element of wavefront aberration is not more that 0.024 times a wavelength of 633 nm of a prove light along said optical axis, and said wavefront aberration is caused by said predetermined refractive index distribution.

6. A photolithography apparatus for performing projection of a pattern image of a mask on a substrate, said apparatus comprising:

illumination optical system for illuminating said mask with a light having a wavelength of not more than 400 nm as an exposure light; and a projection optical system for forming said pattern image of said mask on said substrate, at least one of said illumination optical system and said projection optical system including the optical member according to claim 5.

7. An optical member for light having a wavelength of not more than 400 nm, wherein said optical member has OH group concentration distribution symmetric with respect to an optical axis thereof, and wherein PV value of 2nd- and 4th-order elements in a rotationally symmetric element of wavefront aberration is not more that 0.024 times a wavelength of 633 nm of a prove light along said optical axis, and said wavefront aberration is caused by a predetermined refractive index distribution of said optical member in said optical axis.

8. An optical member for light having a wavelength of not more than 400 nm, wherein OH group concentration distribution of said optical member is symmetrical with respect to an optical axis thereof, and wherein a PV value measured by the following measuring method is not more than 0.024 times a wavelength of a prove light, said measuring method comprising the steps of:

illuminating said optical member with said prove light having a wavelength of 633 nm along said optical axis thereof and measuring refractive indexes in said optical axis;

fitting even-order polynomials including Zero-order polynomial to the measured refractive indexes by a least square method to minimize the differences between the even-order polynomials and the measured refractive indexes; and calculating the PV value of 2nd- and 4th- polynomials.

9. An optical member as claimed in claim 1, wherein said root mean square value is not more than 0.005 times said wavelength of said prove light, and said measuring method further comprises a step of:

eliminating 2nd and 4th order elements of said even-order polynomials obtained in said fitting step from rotationally symmetric elements.

10. An optical member as claimed in claim 2, wherein said root means square value is not more than 0.004 times said wavelength of a prove light.

11. A photolithography apparatus for performing projection of a pattern image of a mask on a substrate, said apparatus comprising:

illumination optical system for illuminating said mask with a light having a wavelength of not more than 400 nm as an exposure light; and a projection optical system for forming said pattern image of said mask on said substrate, at least one of said illumination optical system and said projection optical system including the optical member according to claim 10.

* * * * *